(12) United States Patent
Okita

(10) Patent No.: US 7,700,978 B2
(45) Date of Patent: Apr. 20, 2010

(54) SEMICONDUCTOR DEVICE AND METHOD OF MANUFACTURING THE SAME

(75) Inventor: Yoichi Okita, Kanagawa (JP)

(73) Assignee: Fujitsu Microelectronics Limited, Yokohama (JP)

( * ) Notice: Subject to any disclaimer, the term of this patent is extended or adjusted under 35 U.S.C. 154(b) by 217 days.

(21) Appl. No.: 11/785,623

(22) Filed: Apr. 19, 2007

(65) Prior Publication Data

US 2007/0205450 A1 Sep. 6, 2007

Related U.S. Application Data

(63) Continuation of application No. PCT/JP2004/015732, filed on Oct. 22, 2004.

(51) Int. Cl.
H01L 27/00 (2006.01)
(52) U.S. Cl. ...................................... 257/213; 257/296
(58) Field of Classification Search ......... 257/213–413, 257/900, 902, 903, E39, E51.038–E51.04, 257/E23.074, E23.165
See application file for complete search history.

(56) References Cited

U.S. PATENT DOCUMENTS

| | | | |
|---|---|---|---|
| 6,515,339 B2 * | 2/2003 | Shin et al. ................... | 257/368 |
| 6,803,260 B2 | 10/2004 | Shin et al. | |
| 7,335,603 B2 * | 2/2008 | Mancevski ................... | 438/758 |
| 2001/0045856 A1 * | 11/2001 | Ooishi ......................... | 327/277 |
| 2002/0004249 A1 * | 1/2002 | Kawakubo ..................... | 438/3 |
| 2002/0014667 A1 | 2/2002 | Shin et al. | |
| 2002/0163079 A1 * | 11/2002 | Awano ........................ | 257/750 |
| 2002/0187597 A1 * | 12/2002 | Ninomiya .................... | 438/197 |
| 2003/0209802 A1 | 11/2003 | Awano | |
| 2003/0214054 A1 * | 11/2003 | Awano et al. ................ | 257/797 |
| 2004/0164327 A1 | 8/2004 | Shin et al. | |
| 2004/0182600 A1 * | 9/2004 | Kawabata et al. ............ | 174/250 |

FOREIGN PATENT DOCUMENTS

| | | |
|---|---|---|
| JP | 2002-329723 A | 11/2002 |
| JP | 2003-309266 A | 10/2003 |
| JP | 2003-332504 A | 11/2003 |
| JP | 2004-241572 A | 8/2004 |
| JP | 2004-288833 A | 10/2004 |

OTHER PUBLICATIONS

Wolfgan Hoenlein; "New Prospect for Microelectronics: Carbon Nanotubes"; Jpn. J. Appln. Phys., Jun. 2002, vol. 41, No. 6B, pp. 4370-4374.
International Search Report of PCT/JP2004/015732, date of mailing Jan. 25, 2005.
Translation of the International Preliminary Report on Patentability of International Application No. PCT/JP 2004/015732, with Form PCT/IB/373 and Form PCT/ISA/237.

* cited by examiner

*Primary Examiner*—Leonardo Andújar
*Assistant Examiner*—Jordan Klein
(74) *Attorney, Agent, or Firm*—Westerman, Hattori, Daniels & Adrian, LLP

(57) ABSTRACT

A plurality of origin patterns (3) containing a metal catalyst are formed over a semiconductor substrate (1). Next, an insulating film (4) covering the origin patterns (3) is formed. Next, a trench allowing at the both ends thereof the side faces of the origin patterns (3) to expose is formed. Thereafter, a wiring is formed by allowing carbon nanotubes (5) having a conductive chirality to grow in the trench. Thereafter, an insulating film covering the carbon nanotubes (5) is formed.

15 Claims, 48 Drawing Sheets

SEMICONDUCTOR DEVICE AND METHOD OF MANUFACTURING THE SAME

TECHNICAL FIELD

The present invention relates to a semiconductor device using carbon nanotubes, and a method of manufacturing the same.

BACKGROUND ART

There are growing demands on miniaturization of semiconductor devices, and consequently also on increase in current density required for wirings. According to the International Technology Road Map for Semiconductors (2002), maximum wiring current density necessary for semiconductor devices will rise almost close to $2\times10^6$ (A/cm$^2$) at around 2005 or thereafter, which cannot be achieved by the conventional Cu wirings or the like.

One candidate of wiring materials capable of solving this sort of problem can be exemplified by carbon nanotube. Maximum current density of wiring made of carbon nanotubes is at an order of magnitude of $10^9$ (A/cm$^2$), approximately 1,000 times as large as that of the Cu wirings. The electric resistance thereof is known to be observed as a quantized resistance of approximately 6 k$\Omega$ per a single carbon nanotube. Low resistance wirings can therefore be formed by increasing the number of carbon nanotubes.

The carbon nanotubes can be configured as semiconductors by controlling the chirality, and has therefore been investigated about their use as a channel of a-field effect transistor. In this sort of field effect transistor, it is generally believed that conductance per unit width is several times as large as an N-channel transistor formed in a Si substrate, and as large as approximately 10 times as large as a P-channel transistor.

As one conventional method of forming a wiring composed of carbon nanotubes, there has been known a method of growing carbon nanotubes by a thermal CVD process or a plasma CVD process, selectively from the surface of a metal catalyst such as cobalt, nickel, iron or the like.

For example, Japanese Laid-Open Patent Publication No. 2002-329723 describes a method of forming a via-plug using carbon nanotubes, by allowing the carbon nanotubes to grow on a pattern of a metal catalyst in the vertical direction by a CVD process. The publication also describes a method of forming horizontally-extending wirings, by allowing the carbon nanotubes to grow, while being applied with electric field in the horizontal direction.

Japanese Laid-Open Patent Publication No. 2002-118248 describes a method of forming wirings horizontally extending as explained below. First, a line pattern of metal catalyst is formed, and a vertical growth suppressive layer is then formed thereon. Next, an opening is formed by a single process in the vertical growth suppressive layer and the line pattern. Carbon nanotubes are then grown between the patterns opposed in the opening. A description is made also on another method, in which a vertical growth suppressive layer is selectively formed, the line pattern is patterned, and the carbon nanotubes are grown thereafter.

Wolfgang Hoenlein (Jpn. J. Appl. Phys., Vol. 41 (2002) pp. 4370-4374) illustrates a carbon nanotube wiring applied by a damascene process, but no description is given on a method of forming the wiring.

It is, however, difficult to control the growth direction and the length of the carbon nanotubes in the method disclosed in Japanese Laid-Open Patent Publication No. 2002-329723. The method described in Japanese Laid-Open Patent Publication No. 2002-118248 is in need of forming the opening by a single process in the vertical growth suppressive layer and the line pattern of metal catalyst. It is, however, difficult to etch the metal catalyst such as Co, Ni, iron and the like, and the vertical growth suppressive layer in a series of process. In particular, the difficulty grows to a considerable degree, when the metal catalyst is thick. Moreover, any attempt of etching the metal catalyst by dry etching may cause adhesion of by-products on the side wall of the opening, from where the carbon nanotubes may undesirably grow. The method of selectively forming the vertical growth suppressive layer suffers from difficulty in controlling the direction of growth of the carbon nanotubes.

In the above-described literatures, there are no descriptions about methods of growing carbon nanotubes. It is also anticipated that the structure, having the metal catalyst selectively formed in a part of individual contacts, will be complicated.

[Patent Document 1] Japanese Laid-Open Patent Publication No. 2002-329723

[Patent Document 2] Japanese Laid-Open Patent Publication No. 2002-118248

[Non-Patent Document 1] Wolfgang Hoenlein (Jpn. J. Appl. Phys., Vol. 41 (2002), pp. 4370-4374)

SUMMARY OF THE INVENTION

It is a first object of the present invention to provide a semiconductor device having wirings composed of carbon nanotubes appropriately extending in the direction in parallel with the surface of a substrate, and a method of manufacturing the same.

It is a second object of the present invention to provide a semiconductor device having a channel composed of carbon nanotubes appropriately extending in the direction in parallel with the surface of a substrate, and a method of manufacturing the same.

After extensive investigations aimed at solving the above-described problems, the present inventor has conceived various embodiments of the present invention described below.

A first semiconductor device according to the present invention has an insulating film formed over a semiconductor substrate. The insulating film has a trench formed therein. In the trench, a wiring composed of carbon nanotubes is formed.

A second semiconductor device according to the present invention has a semiconductor substrate; a plurality of semiconductor elements formed on the surface of the semiconductor substrate; and a multi-layered wiring connecting the semiconductor elements. At least a portion of the multi-layered wiring extending in parallel with the surface of the substrate is composed of carbon nanotubes exposed to an external.

In a first method of manufacturing a semiconductor device according to the present invention, a plurality of origin patterns containing a metal catalyst are formed over a semiconductor substrate, and an insulating film covering the origin patterns is then formed. Next, a trench allowing at the both ends thereof the side faces of the origin pattern to expose is formed in the insulating film. Next, a wiring is formed in the trench by allowing carbon nanotubes having a conductive chirality to grow therein. An interlayer insulating film covering the carbon nanotubes is then formed.

In a second method of manufacturing a semiconductor device according to the present invention, at least two origin patterns containing a metal catalyst are formed over a semiconductor substrate, and an insulating film covering the origin patterns is then formed. Next, a trench allowing at the both ends thereof the side faces of the origin patterns to expose is formed in the insulating film. A channel is then formed in the trench, by allowing carbon nanotubes having a semi-conductive chirality to grow therein.

DETAILED DESCRIPTION OF THE PREFERRED EMBODIMENTS

Paragraphs below will specifically explain embodiments of the present invention, referring to the attached drawings. It is to be noted that the sectional views of the semiconductor device will be explained in conjunction with methods of manufacturing the same, for the convenience sake.

First Embodiment

In the beginning, a first embodiment of the present invention will be explained. FIG. 1A and FIG. 1B to FIG. 10A and to FIG. 10B are drawings sequentially showing process steps of a method of manufacturing a semiconductor device according to the first embodiment of the present invention. FIG. 1B to FIG. 10B are sectional views taken along line I-I in FIG. 1A to FIG. 10A, respectively.

Figure 1A:
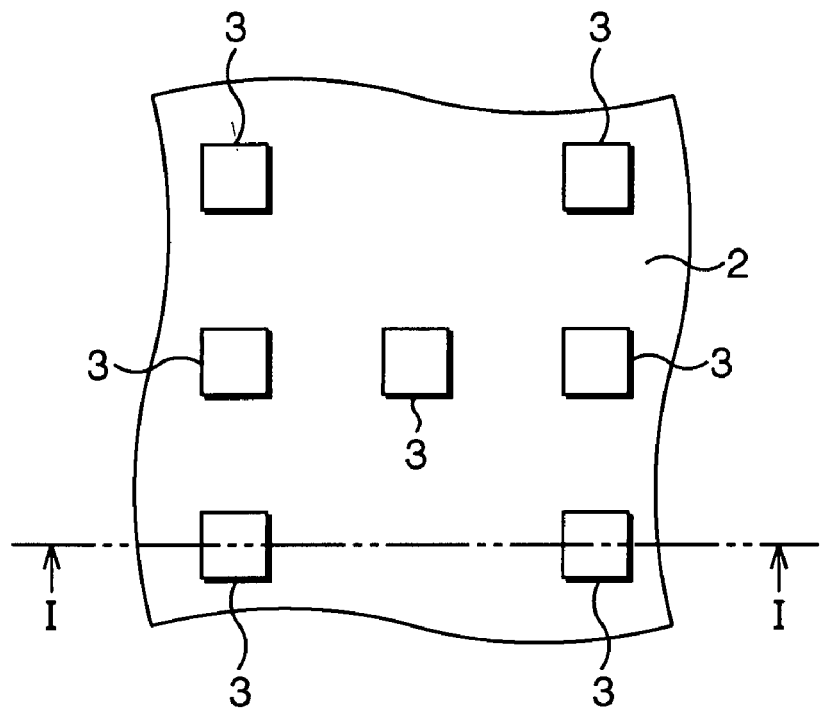
FIG. 1A is a plan view showing a method of manufacturing a semiconductor device according to a first embodiment of the present invention.
Figure 1B:
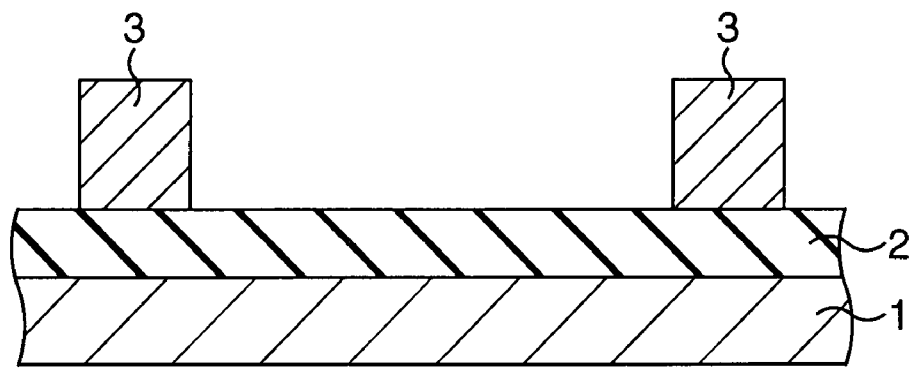
FIG. 1B is a sectional view taken along line I-I in FIG. 1A.

In this embodiment, first as shown in FIG. 1A and FIG. 1B, a Si oxide film 2 is formed on a semiconductor substrate 1, by using TEOS (tetraethylorthosilicate), for example. On the Si oxide film 2, dot patterns 3 composed of a metal catalyst for carbon nanotubes are then formed. Examples of the metal catalyst include cobalt (Co), nickel (Ni), iron (iron) and so forth. Positions of formation of the dot patterns 3 are set to end portions and inflection points of wirings. This is because, in many cases, the carbon nanotubes linearly grow over the minimum distance between catalyst patterns. Sectional geometry involving height and width of the dot patterns 3 is determined depending on thickness of wirings (the number of carbon nanotubes) to be formed, that is, resistance required for the wirings to be formed. The side faces of the dot patterns 3 are not necessarily vertical, and may be forward-tapered or reverse-tapered.

Figure 2A:
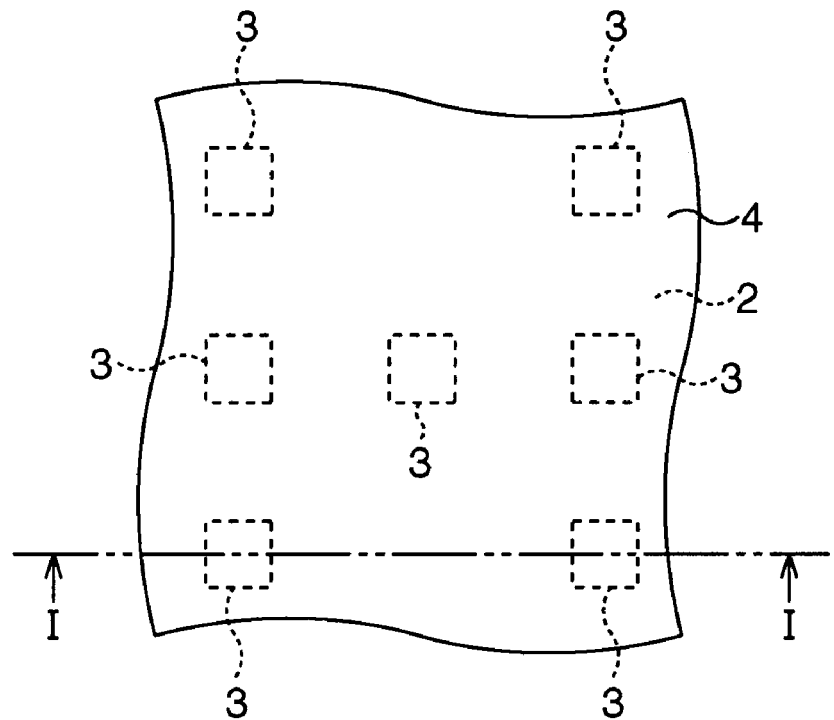
FIG. 2A is a plan view showing, as continued from FIG. 1A, the method of manufacturing a semiconductor device according to the first embodiment.
Figure 2B:
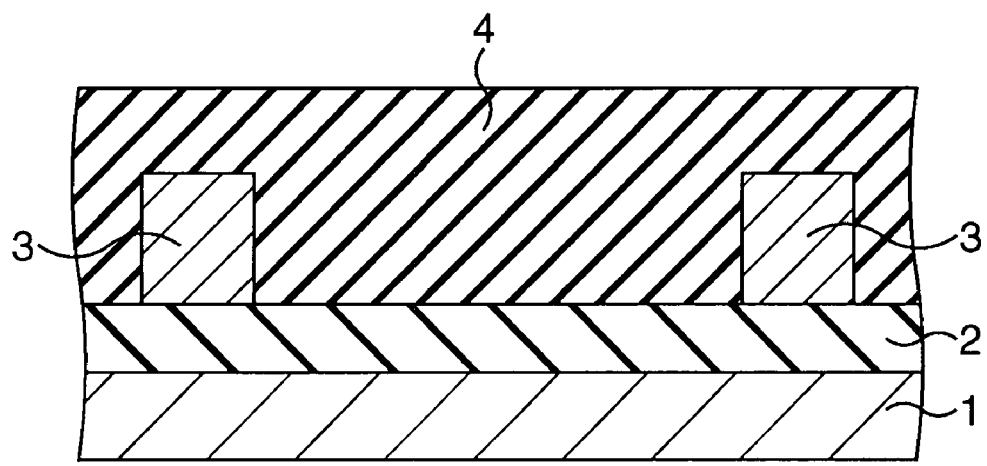
FIG. 2B is a sectional view taken along line I-I in FIG. 2A.

Next, as shown in FIG. 2A and FIG. 2B, an interlayer insulating film 4 covering the dot patterns 3 is formed by using TEOS, for example, and the surface thereof is then planarized by CMP (Chemical Mechanical Polishing) or the like.

Figure 3A:
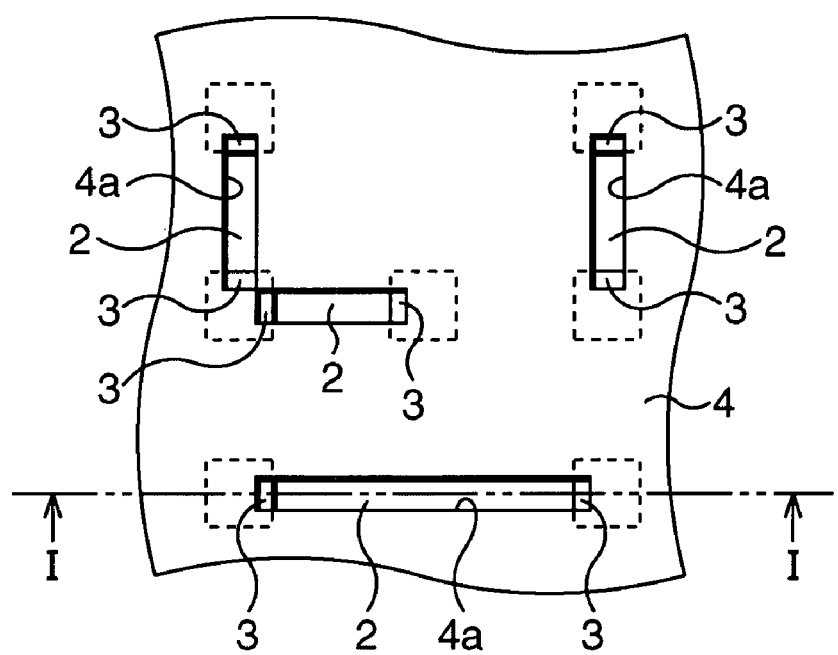
FIG. 3A is a plan view showing, as continued from FIG. 2A, the method of manufacturing a semiconductor device according to the first embodiment.
Figure 3B:
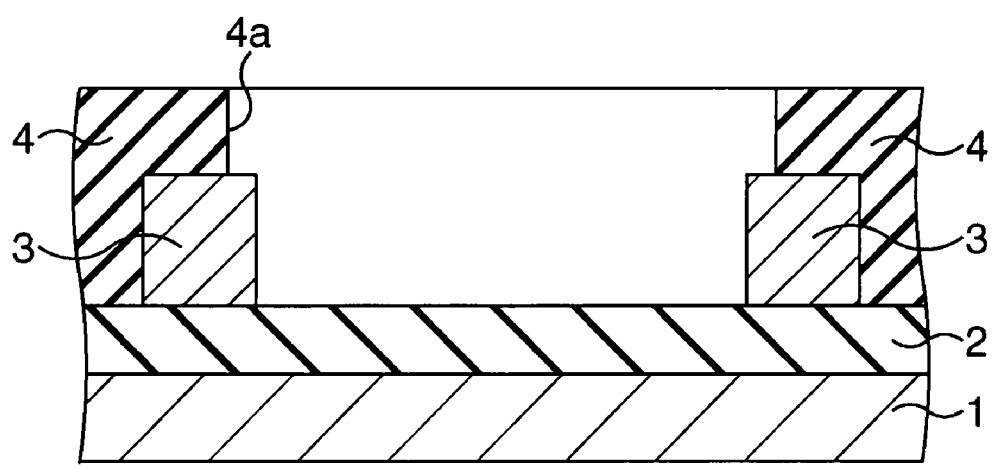
FIG. 3B is a sectional view taken along line I-I in FIG. 3A.

Thereafter, as shown in FIG. 3A and FIG. 3B, trenches 4a are formed in the interlayer insulating film 4 by dry etching, for example, at positions destined for formation of the wirings. This process is proceeded so as to expose, from both ends of the trench 4a, the side faces of the dot patterns 3. This is because the side faces of the dot patterns 3 can serve as origins of growth of carbon nanotubes. In consideration of alignment accuracy in the process of forming the trenches 4a, it is preferable to adopt a design in which both ends of the trenches 4a fall on the top surfaces of the dot patterns 3. In other words, it is preferable to adopt a design in which the dot patterns 3 are slightly exposed out from the trenches 4a. By adopting this design, the side faces of the dot patterns 3 can exactly be exposed, even if any slight misalignment should occur.

In a case where polymers or oxide of the metal catalysts adhere on the side faces of the dot patterns 3 after formation of the trenches 4a, it is preferable to carry out isotropic etching (plasma treatment or wet treatment).

Figure 4A:
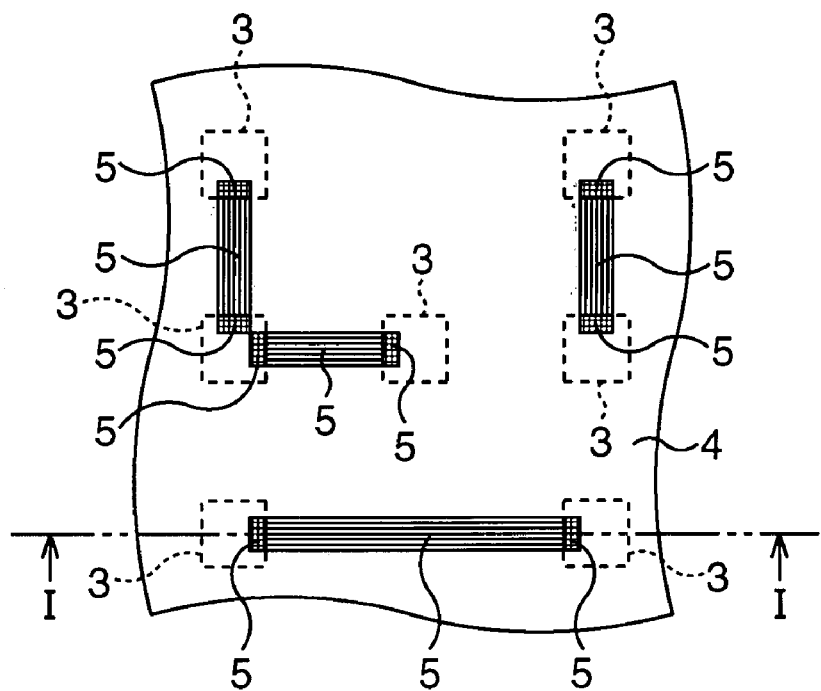
FIG. 4A is a plan view showing, as continued from FIG. 3A, the method of manufacturing a semiconductor device according to the first embodiment.
Figure 4B:
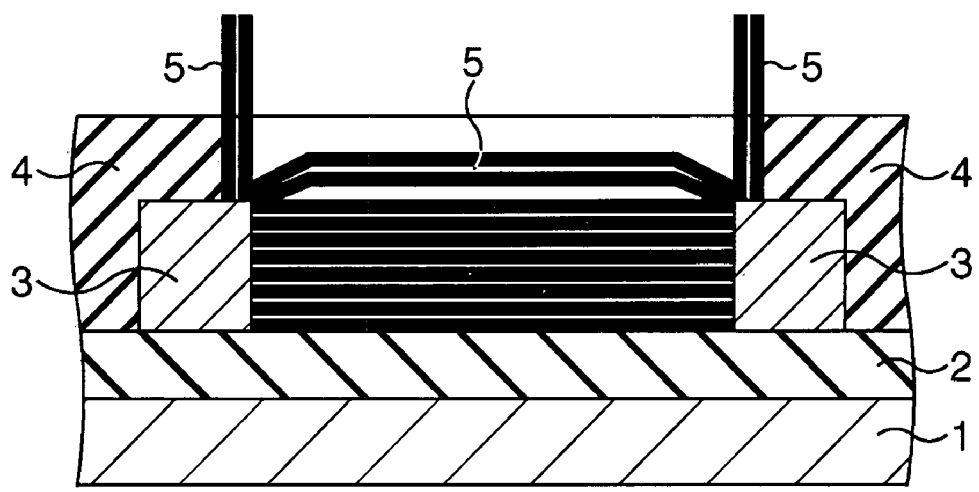
FIG. 4B is a sectional view taken along line I-I in FIG. 4A.

Thereafter, as shown in FIG. 4A and FIG. 4B, carbon nanotubes 5 having an armchair-type chirality (geometric structure) are grown as being originated from the dot patterns 3 by a thermal CVD process or a plasma CVD process. In this process, most of the carbon nanotubes 5 grow between the opposing dot patterns 3, but a part of the carbon nanotubes 5 grows upward from the top surfaces of the dot patterns 3.

Figure 5A:
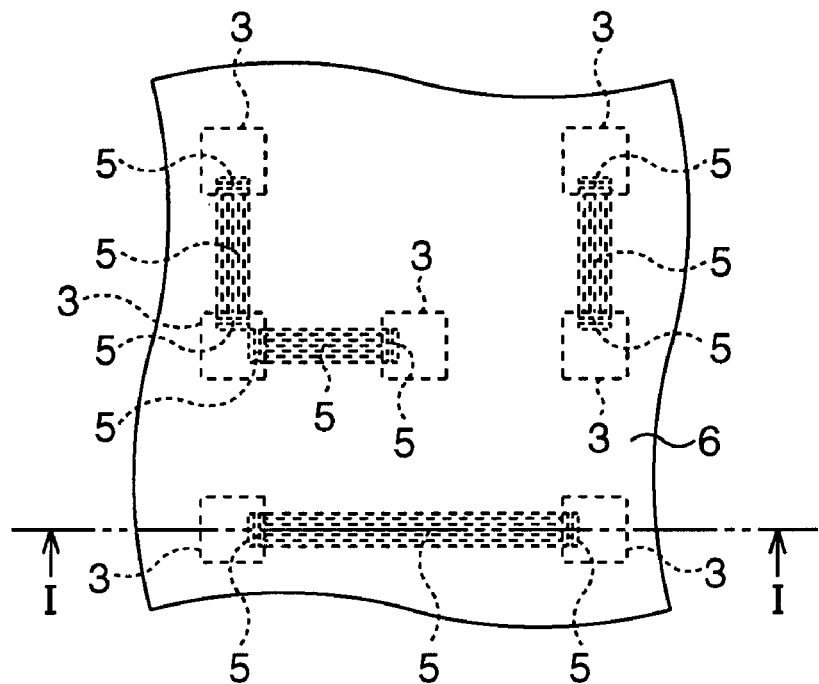
FIG. 5A is a plan view showing, as continued from FIG. 4A, the method of manufacturing a semiconductor device according to the first embodiment.
Figure 5B:
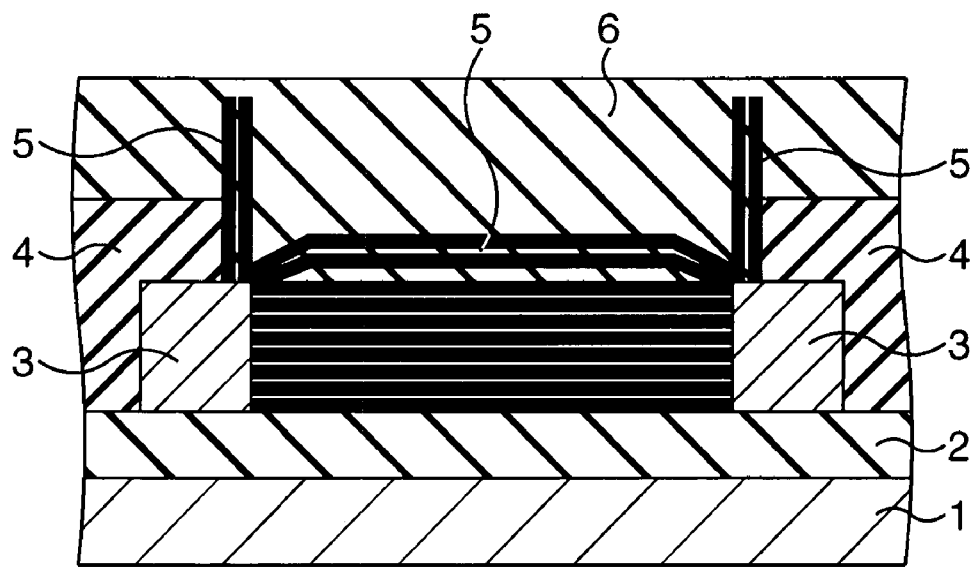
FIG. 5B is a sectional view taken along line I-I in FIG. 5A.

Next, as shown in FIG. 5A and FIG. 5B, a protective film 6 protecting the carbon nanotubes 5 from any damages possibly caused by CMP carried out later is formed. The protective film 6 is preferably formed at least to a thickness enough to bury the trenches 4a, that is, at least to a thickness enough to cover the carbon nanotubes 5 between the dot patterns 3. As the protective film 6, a silicon nitride film or an electro-conductive film is preferably formed, in view of avoiding oxidation of the carbon nanotubes 5. It is also allowable to form an insulating film by sputtering. In view of paying more attention to oxidation of the carbon nanotubes 5, it is also allowable to use a silicon oxide film as the protective film 6.

The protective film 6 is omissible, if the carbon nanotubes 5 shows enough strength against CMP.

Figure 6A:
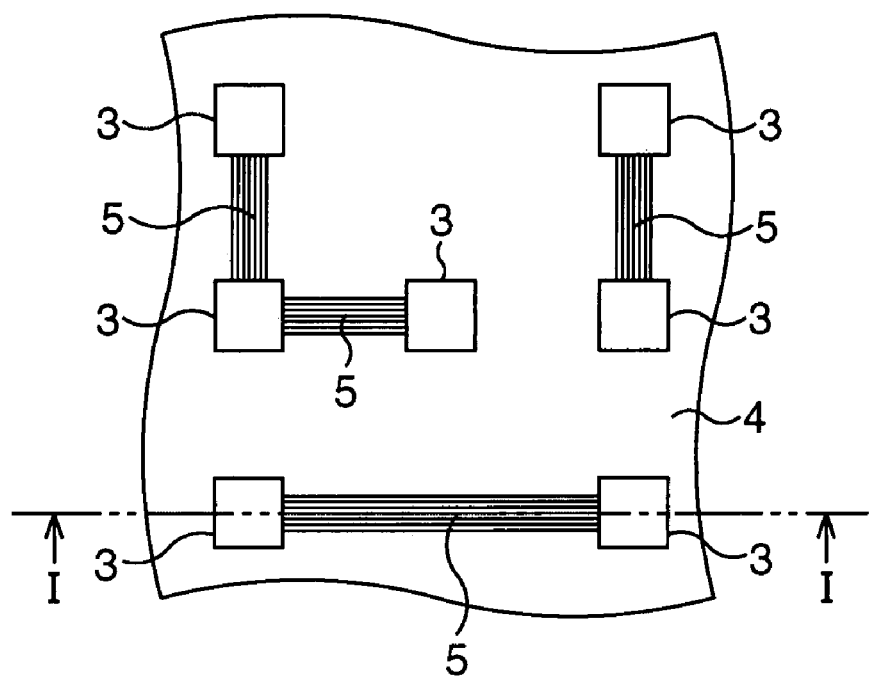
FIG. 6A is a plan view showing, as continued from FIG. 5A, the method of manufacturing a semiconductor device according to the first embodiment.
Figure 6B:
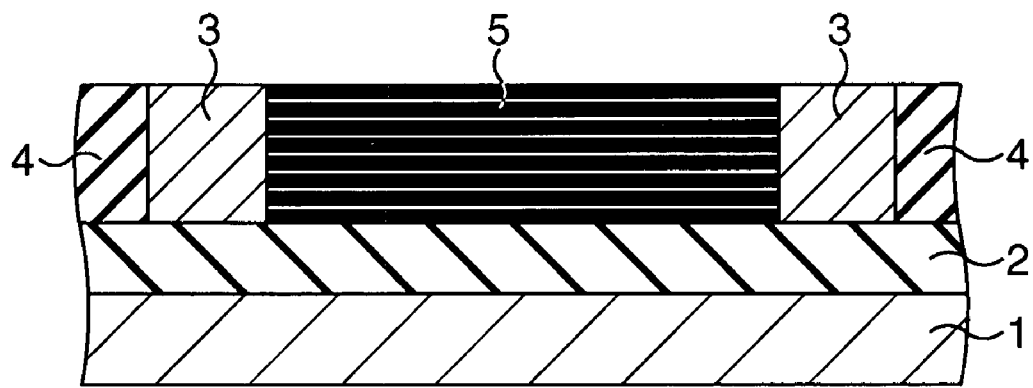
FIG. 6B is a sectional view taken along line I-I in FIG. 6A.

Next, as shown in FIG. 6A and FIG. 6B, the interlayer insulating film 4, the carbon nanotubes 5 and the protective film 6 are removed by CMP or the like, until the dot patterns 3 are exposed.

Figure 7A:
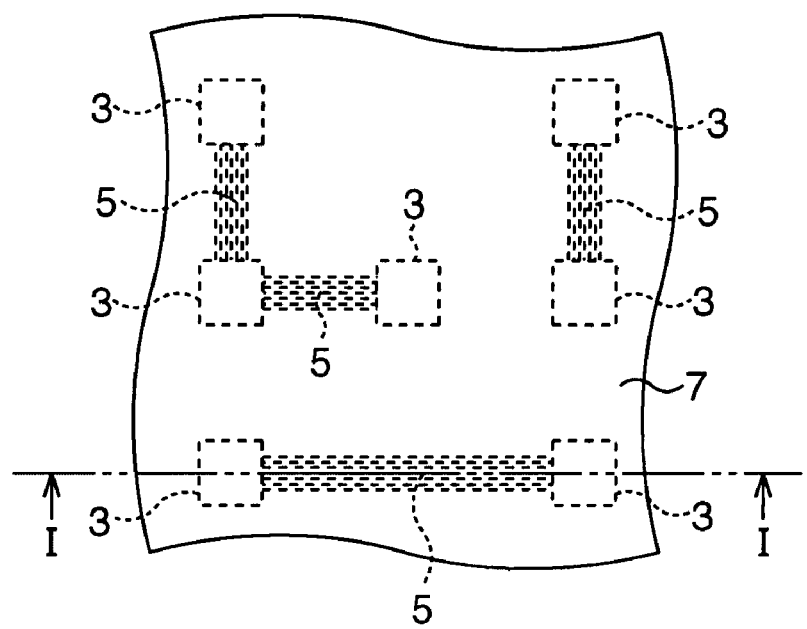
FIG. 7A is a plan view showing, as continued from FIG. 6A, the method of manufacturing a semiconductor device according to the first embodiment.
Figure 7B:
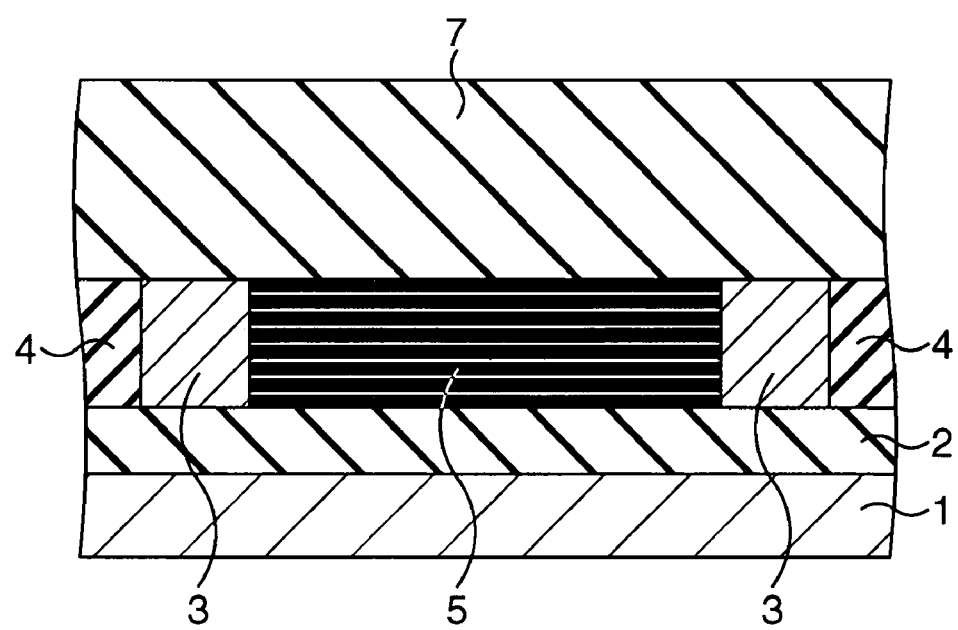
FIG. 7B is a sectional view taken along line I-I in FIG. 7A.

Next, as shown in FIG. 7A and FIG. 7B, an interlayer insulating film 7 is formed over the entire surface with using TEOS, for example. Up to these process steps, a series of process steps of forming the carbon nanotube wiring in the first layer are completed.

Figure 8A:
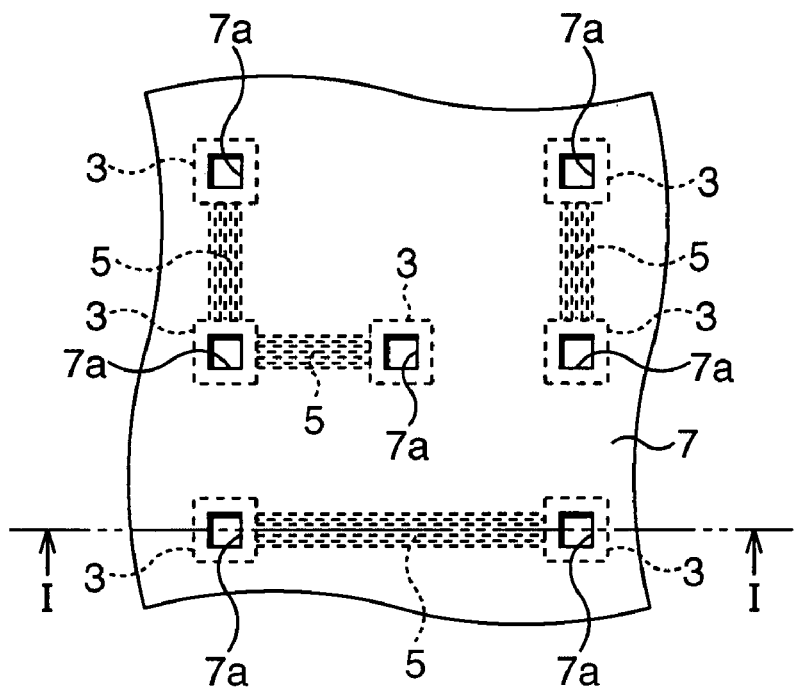
FIG. 8A is a plan view showing, as continued from FIG. 7A, the method of manufacturing a semiconductor device according to the first embodiment.
Figure 8B:
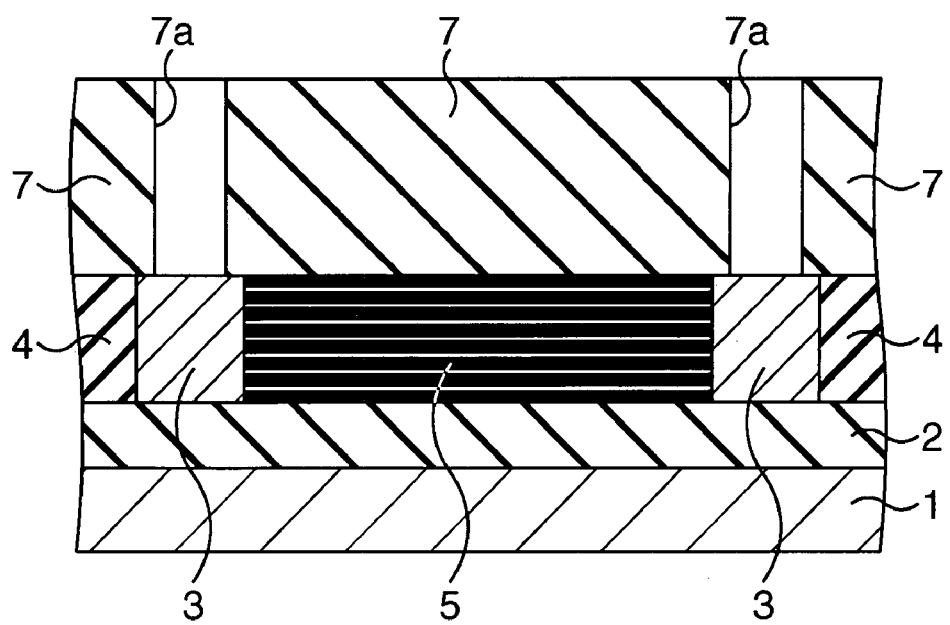
FIG. 8B is a sectional view taken along line I-I in FIG. 8A.

Thereafter, as shown in FIG. 8A and FIG. 8B, openings (via holes) 7a are formed in the interlayer insulating film 7 so as to reach the dot pattern 3. It is, however, not necessary to form the openings 7a on all of the dot patterns.

Figure 9A:
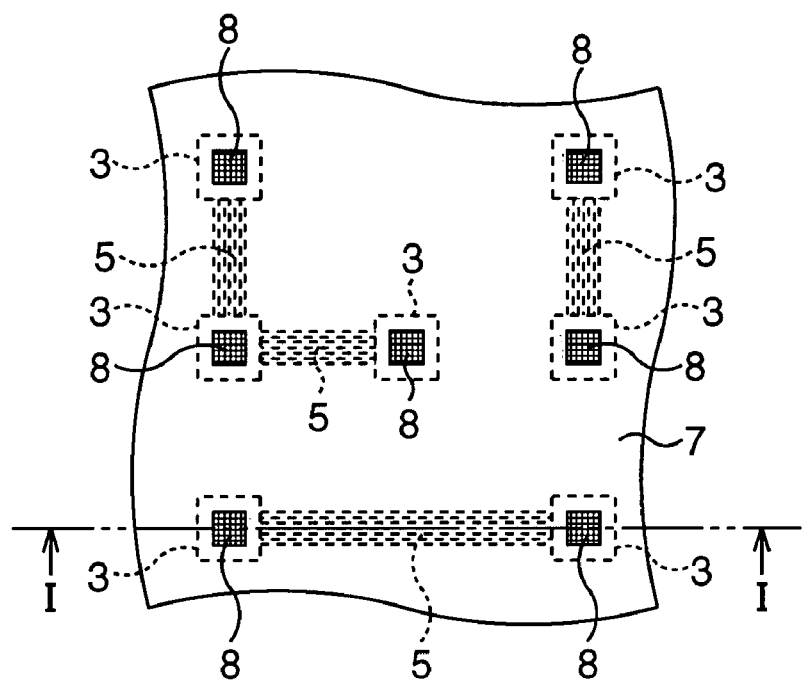
FIG. 9A is a plan view showing, as continued from FIG. 8A, the method of manufacturing a semiconductor device according to the first embodiment.
Figure 9B:
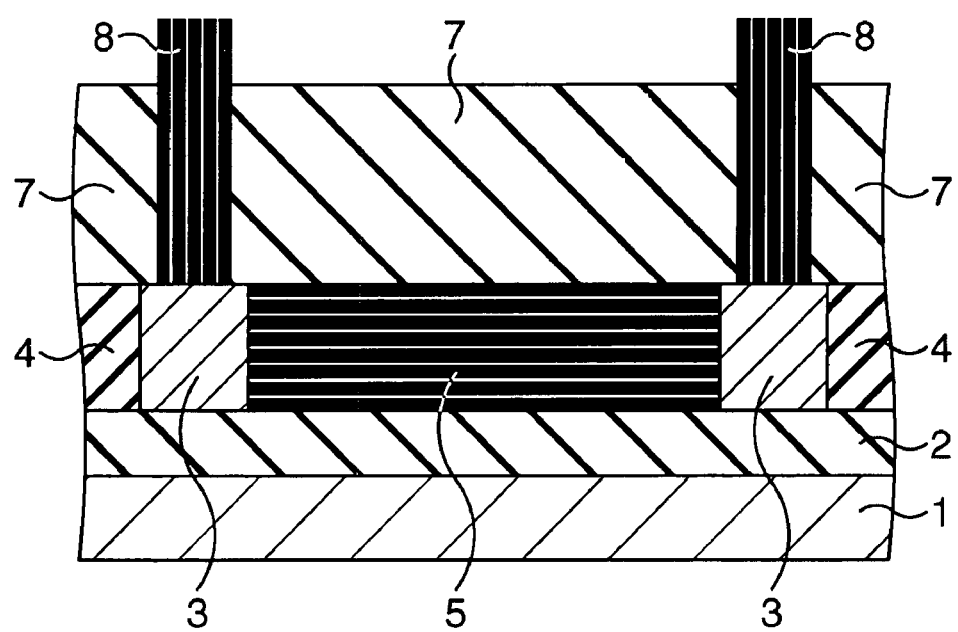
FIG. 9B is a sectional view taken along line I-I in FIG. 9A.

Next, as shown in FIG. 9A and FIG. 9B, the carbon nanotubes 8 are vertically grown by a thermal CVD process or a plasma CVD process, as being originated from the dot patterns 3.

Figure 10A:
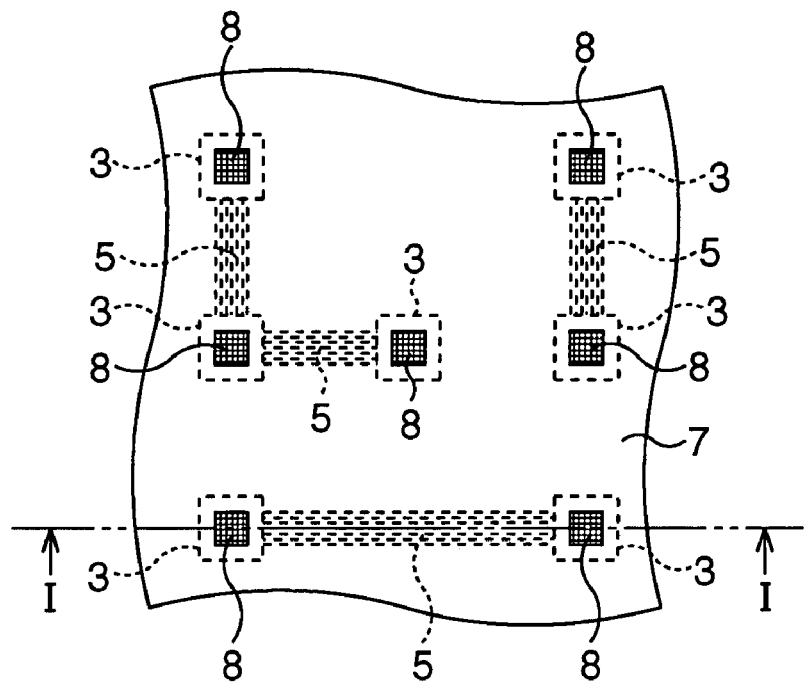
FIG. 10A is a plan view showing, as continued from FIG. 9A, the method of manufacturing a semiconductor device according to the first embodiment.
Figure 10B:
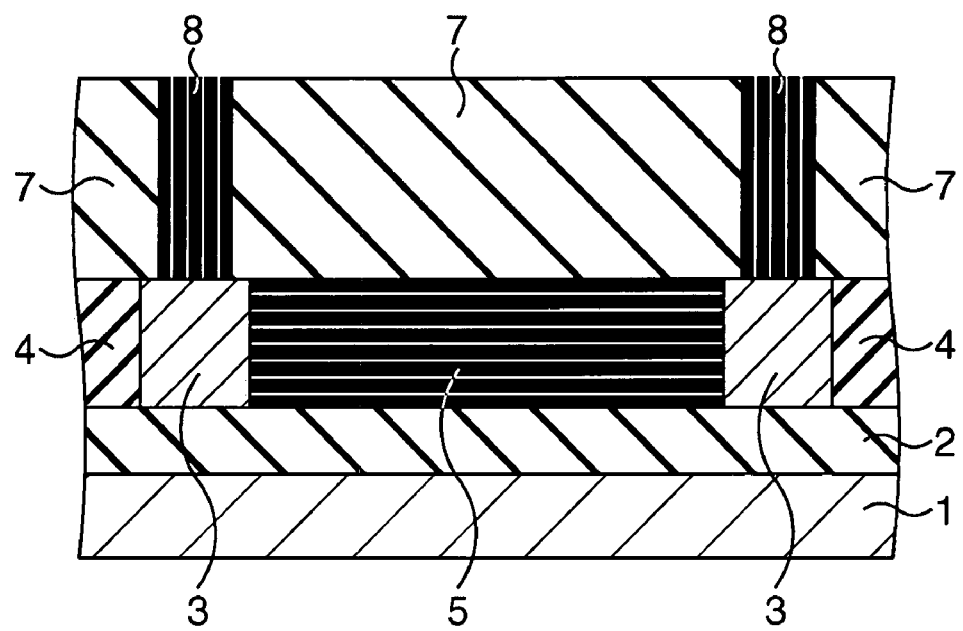
FIG. 10B is a sectional view taken along line I-I in FIG. 10A.

Next, as shown in FIG. 10A and FIG. 10B, portions of the carbon nanotubes 8 projected out from the interlayer insulating film 7 are removed by CMP or the like. As a consequence, a structure having via-plugs buried in the openings 7a is obtained.

Wirings and so forth in the second layer and thereafter are then formed by similar processes, to thereby complete a semiconductor device.

According to the first embodiment as described above, the wirings composed of carbon nanotubes can readily be formed with an excellent accuracy at desired positions.

It is to be noted that the geometry of the dot patterns 3 is preferably determined depending on resistance required for the wirings to be formed as described above, and it is preferable that also the width and height of the trenches 4a are determined based on the resistance of the wirings. The carbon nanotubes 5 formed in the trenches 4a are varied in their number of formation per unit area or characteristics such as conductivity depending on their conditions of growth. It is therefore preferable to determine the geometry of the trenches 4a and the conditions of growth so as to successfully obtain desired resistivity. As for the width of the dot patterns 3 and the width of the trenches 4a, either one may be larger, or the both may be equivalent.

Figure 11:
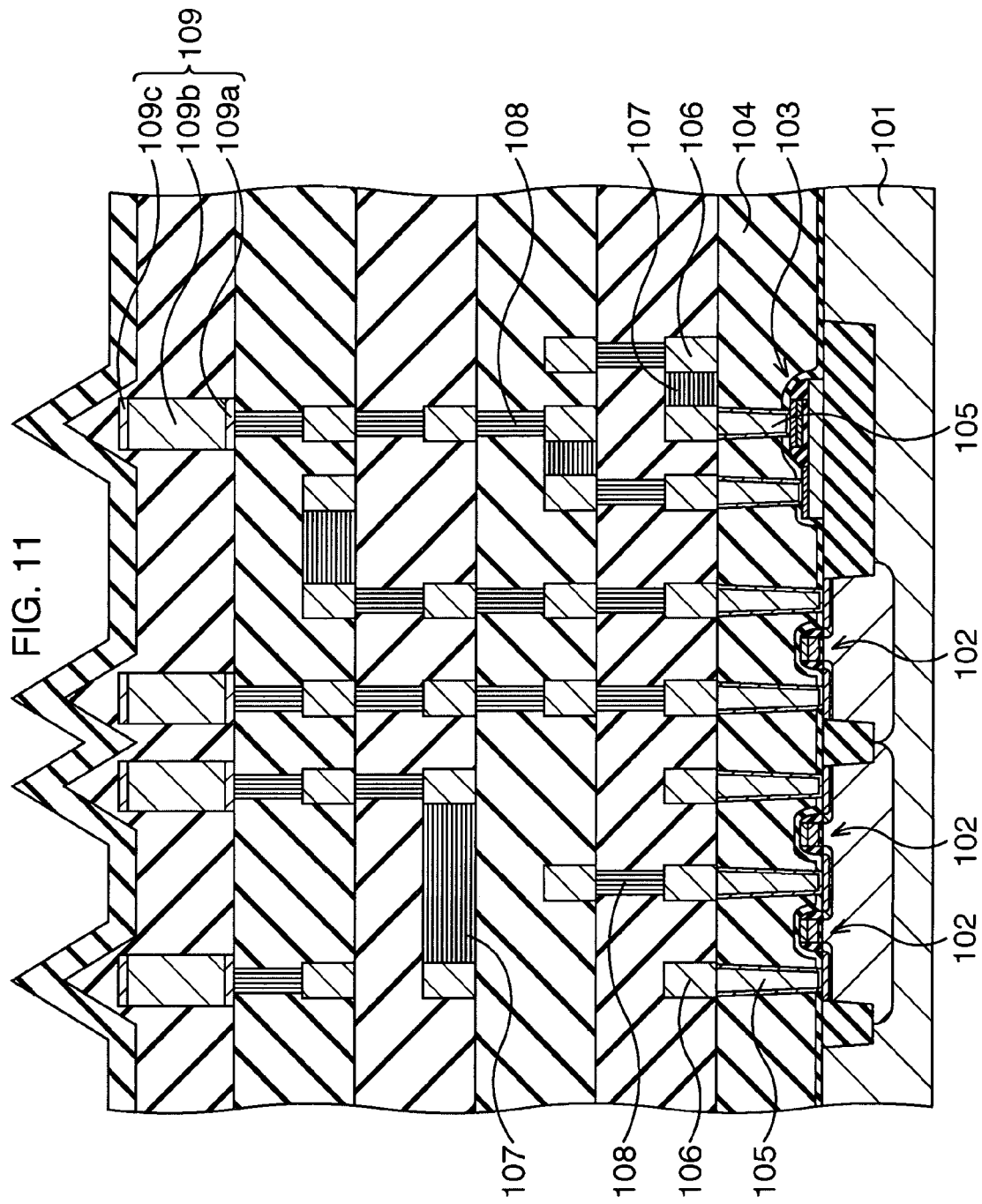
FIG. 11 is a sectional view showing a structure of a semiconductor device manufactured as being applied with the first embodiment.

A structure of a semiconductor device manufactured as being applied with the first embodiment will be given as shown in FIG. 11. More specifically, MOS transistors 102, capacitors 103 and so forth are formed on a semiconductor substrate 101, and an interlayer insulating film 104 is formed so as to cover these components. The interlayer insulating film 104 has the openings which reach electrodes of the MOS transistors 102, the capacitors 103 and so forth, and has W plugs 105 formed therein. On and above the interlayer insulating film 104, there are formed a plurality of origin patterns 106 containing a metal catalyst, a plurality of wirings 107 and via-plugs 108 composed of carbon nanotubes. Each of pad layers 109 is composed, for example, of a barrier metal film 109a, an Al film 109b and a barrier metal film 109c.

Second Embodiment

Next, a second embodiment of the present invention will be explained. In the second embodiment, wirings and via-plugs composed of carbon nanotubes are formed at the same time. FIG. 12A and FIG. 12B to FIG. 16A and FIG. 16B are drawing sequentially showing process steps of the method of manufacturing a semiconductor device according to the second embodiment of the present invention.

Figure 12A:
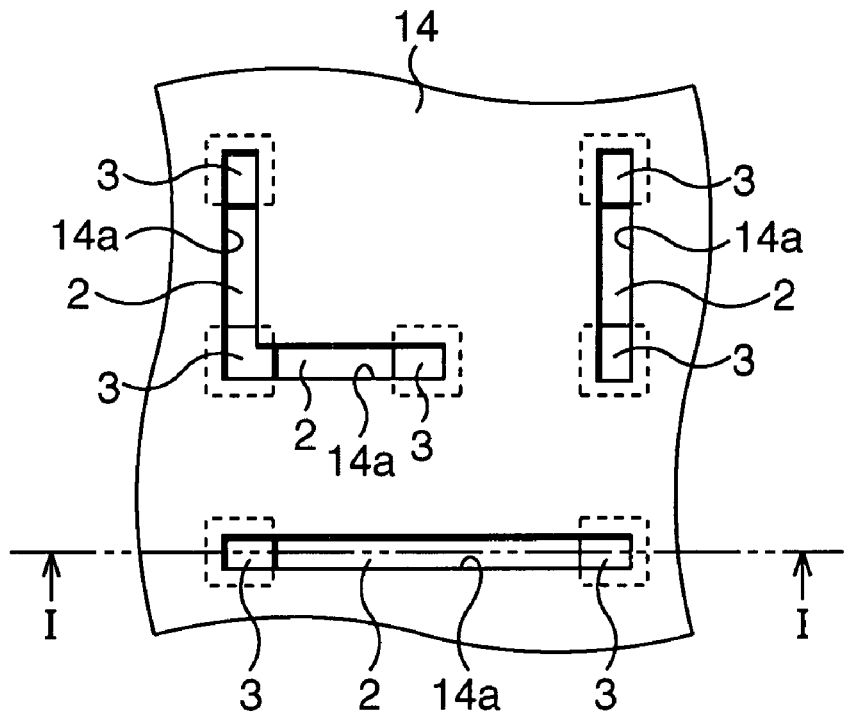
FIG. 12A is a plan view showing a method of manufacturing a semiconductor device according to a second embodiment of the present invention.
Figure 12B:
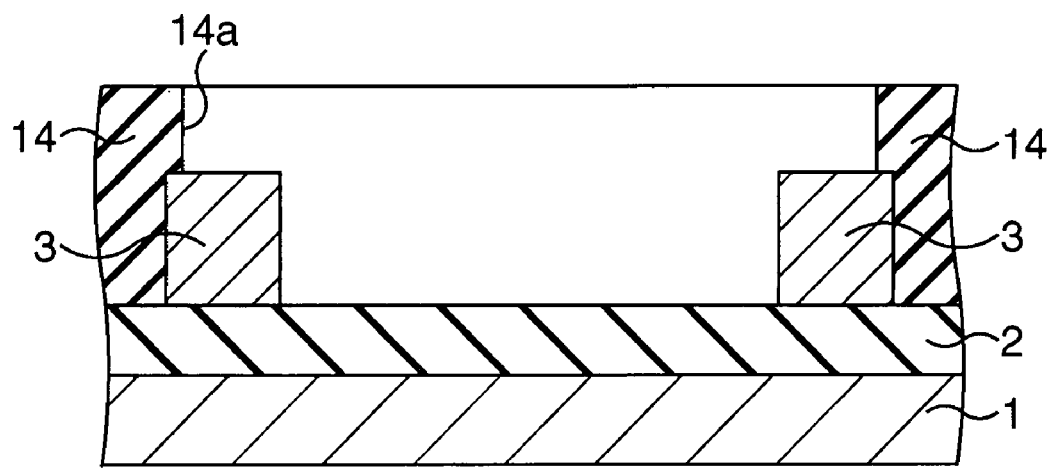
FIG. 12B is a sectional view taken along line I-I in FIG. 12A.

In the second embodiment, the process steps up to the formation of the dot patterns 3 are carried out similarly to as in the first embodiment, and an interlayer insulating film 14 covering the dot patterns 3 is then formed, as shown in FIG. 12A and FIG. 12B, with using TEOS, for example. Next, the surface thereof is planarized by CMP or the like. Trenches 14a are then formed in the interlayer insulating film 14 at positions destined for formation of the wirings by dry etching, for example. This process is proceeded so as to expose, from both ends of each trench 14a, not only the side faces but also the top surfaces of the dot patterns 3. This is because the top surfaces of the dot patterns 3 can serve as the origins of growth of the carbon nanotubes for forming the via-plugs. In consideration of alignment accuracy in the process of forming the trenches 14a, it is preferable to adopt a design in which both ends of the trenches 14a fall on the top surfaces of the dot patterns 3. In other words, it is preferable to adopt a design in which the dot patterns 3 having the exposed top surfaces are slightly covered with the interlayer insulating film 14. By adopting this design, the side faces of the dot patterns 3 can exactly be exposed so as to provide an area sufficient for formation of the via-plugs, even if any slight misalignment occurs. It is, however, not necessary to expose the top surfaces of all dot patterns 3, similar to the openings 7a in the first embodiment.

In a case where polymers or oxide of the metal catalysts adhere on the side faces of the dot patterns 3 after formation of the trenches 14a, it is preferable, as the occasion demands, to carry out isotropic etching, similarly to as in the first embodiment.

Figure 13A:
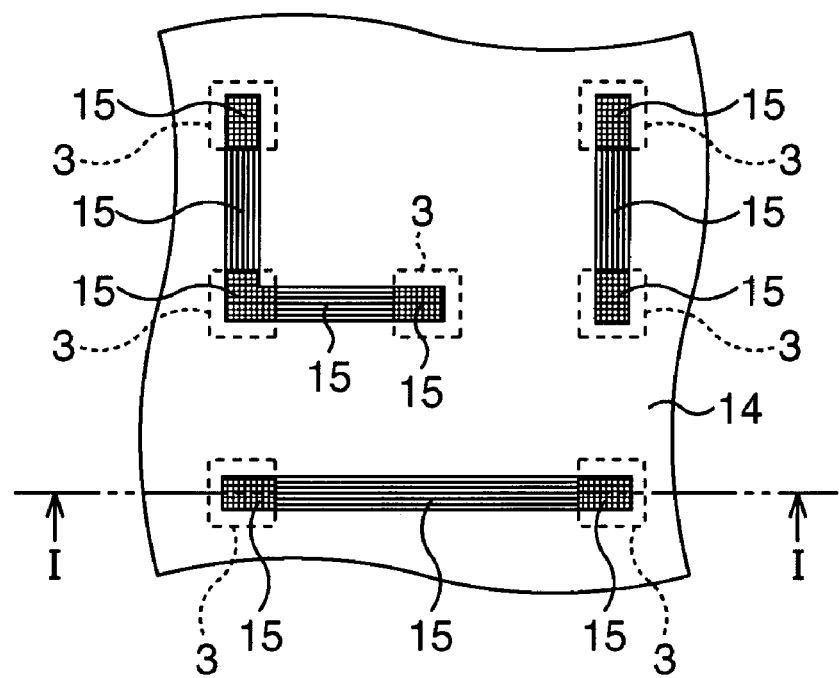
FIG. 13A is a plan view showing, as continued from FIG. 12A, the method of manufacturing a semiconductor device according to the second embodiment.
Figure 13B:
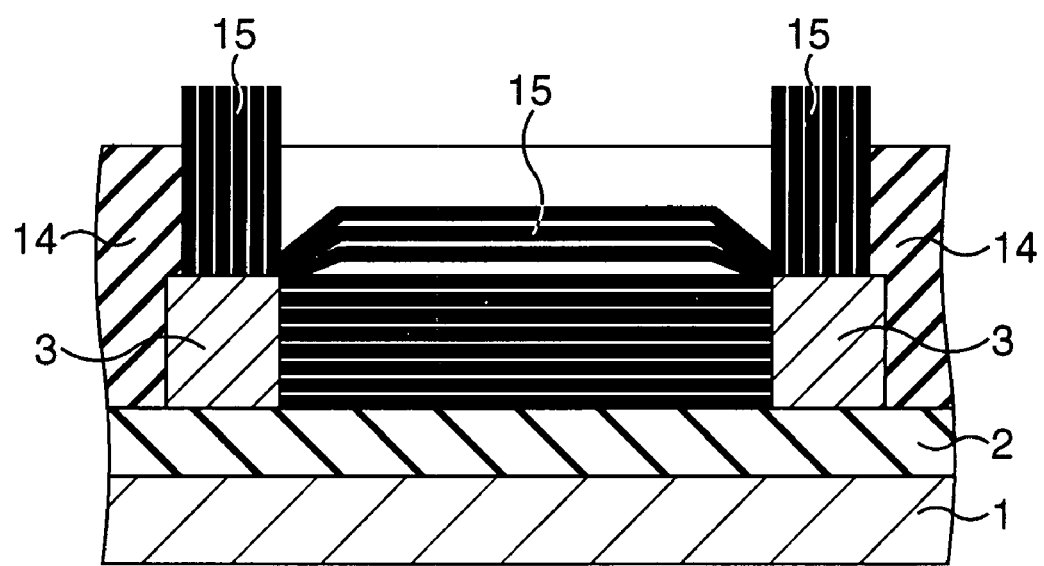
FIG. 13B is a sectional view taken along line I-I in FIG. 13A.

Thereafter, as shown in FIG. 13A and FIG. 13B, carbon nanotubes 15 are grown as being originated from the dot patterns 3, by a thermal CVD process or a plasma CVD process. In this process, the carbon nanotubes 15 grow between the opposing dot patterns 3, and also grow upward from the top surfaces of the dot patterns 3.

Figure 14A:
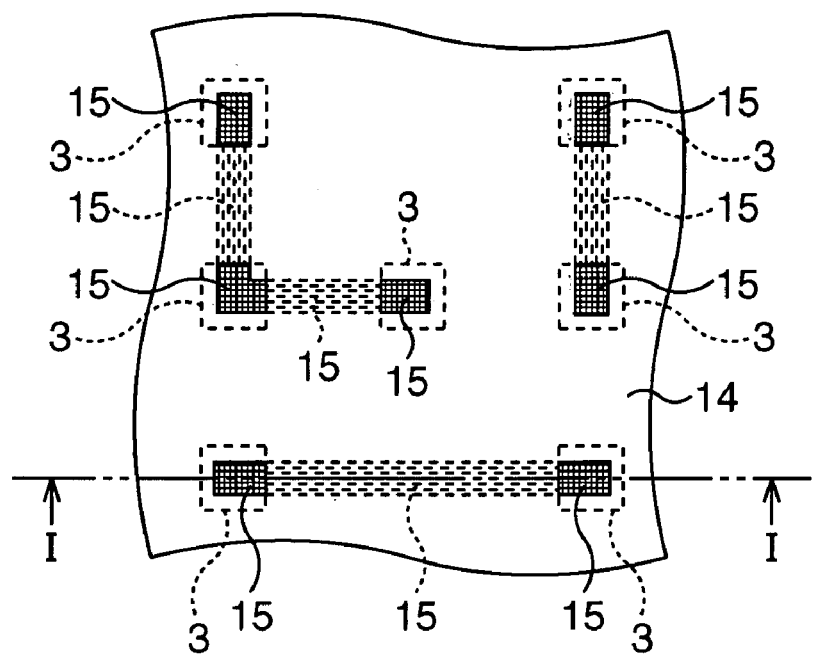
FIG. 14A is a plan view showing, as continued from FIG. 13A, the method of manufacturing a semiconductor device according to the second embodiment.
Figure 14B:
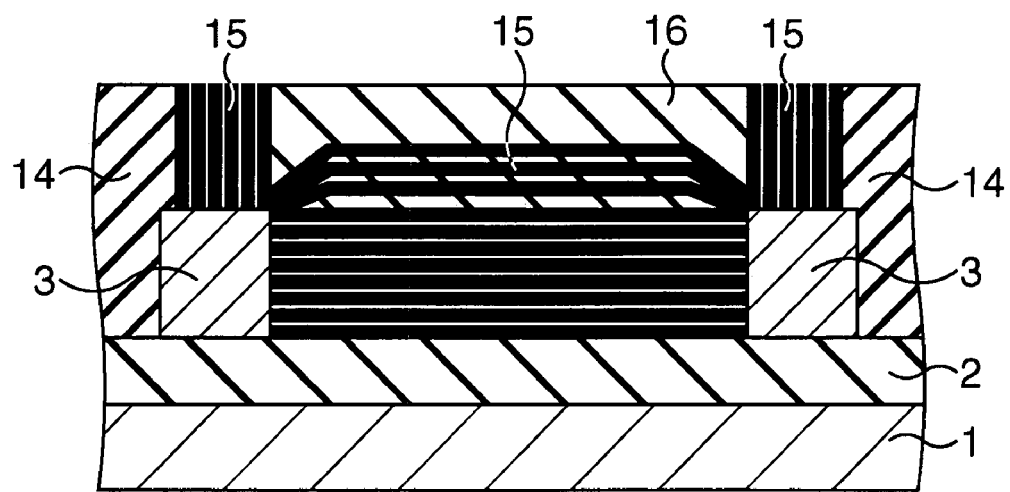
FIG. 14B is a sectional view taken along line I-I in FIG. 14A.

Next, as shown in FIG. 14A and FIG. 14B, an interlayer insulating film 16 is formed over the entire surface with using TEOS, for example, and portions of the carbon nanotubes 15 projected out from the interlayer insulating film 16 are removed by CMP or the like. As a consequence, a structure having via-plugs formed in the layer composed of the interlayer insulating films 14 and 16 is obtained.

Figure 15A:
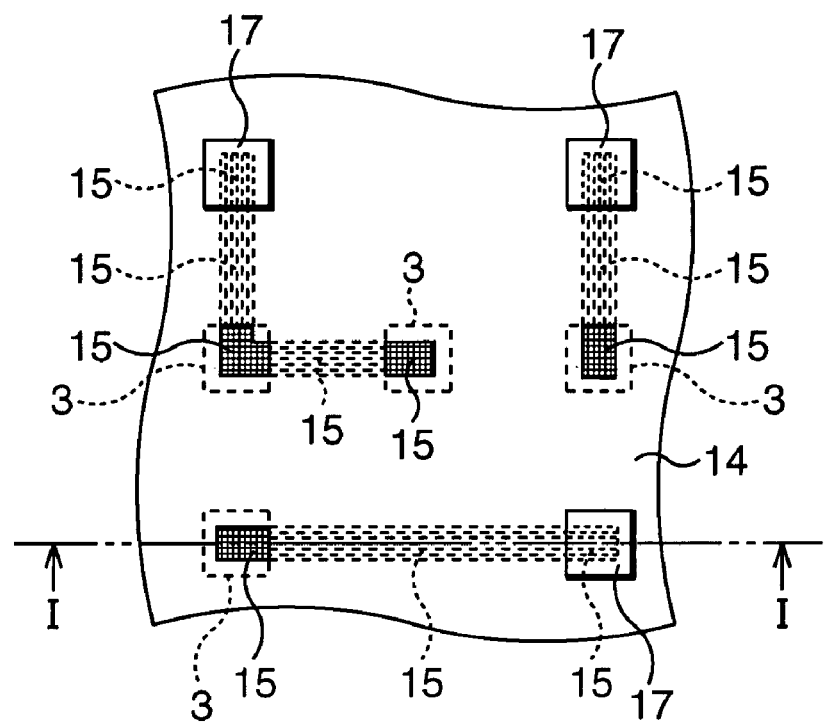
FIG. 15A is a plan view showing, as continued from FIG. 14A, the method of manufacturing a semiconductor device according to the second embodiment.
Figure 15B:
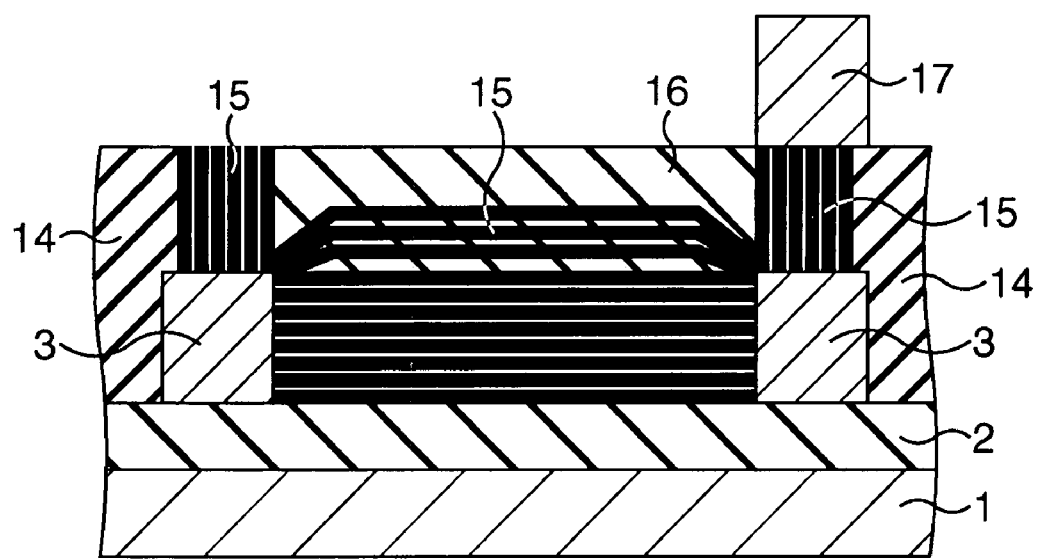
FIG. 15B is a sectional view taken along line I-I in FIG. 15A.

Next, as shown in FIG. 15A and FIG. 15B, dot patterns 17 composed of a metal catalyst are formed at positions necessary for forming wirings in the second layer or thereafter.

Figure 16A:
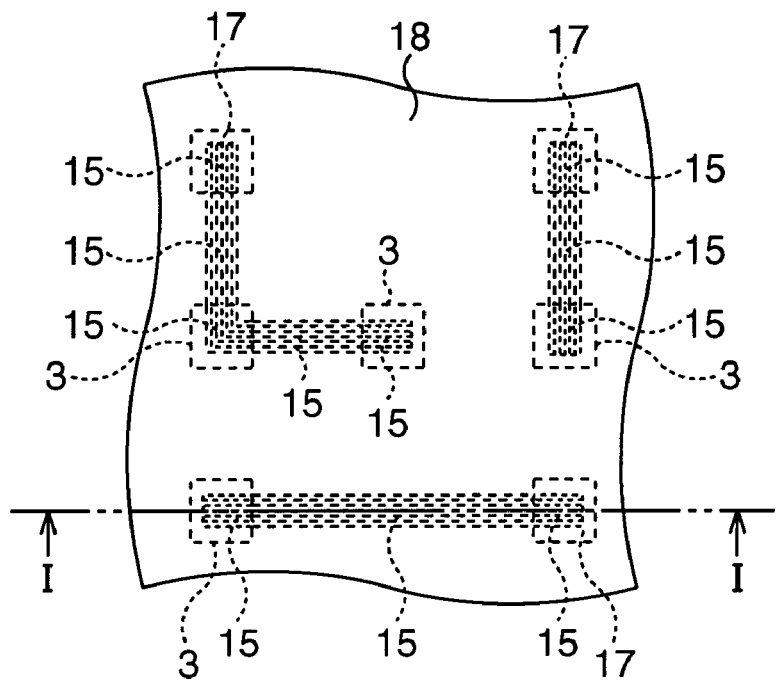
FIG. 16A is a plan view showing, as continued from FIG. 15A, the method of manufacturing a semiconductor device according to the second embodiment.
Figure 16B:
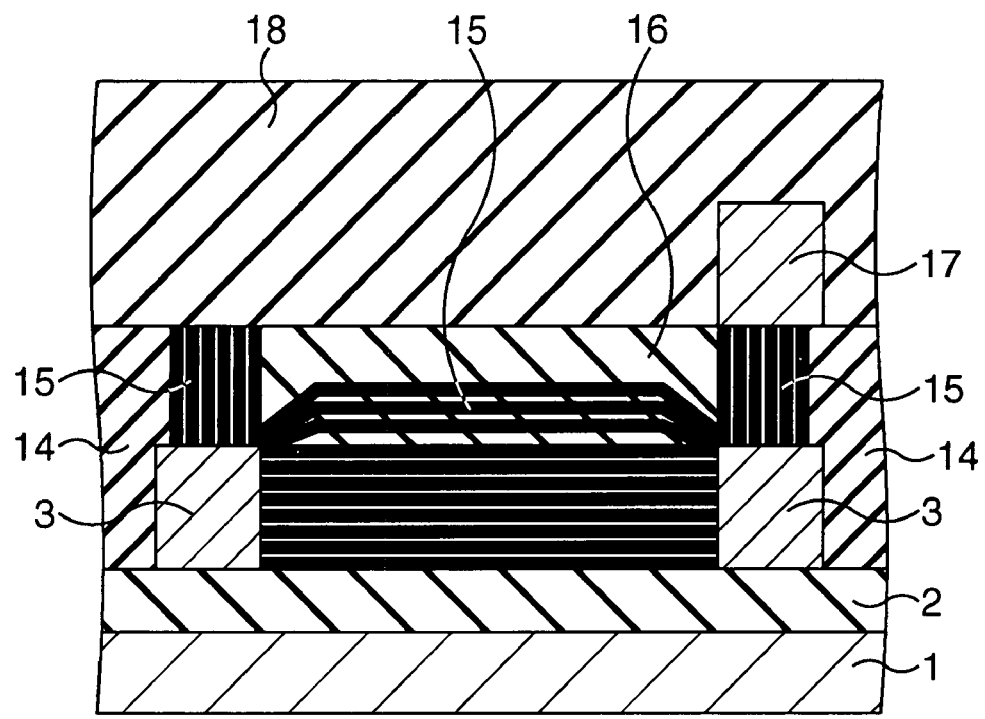
FIG. 16B is a sectional view taken along line I-I in FIG. 16A.

Next, as shown in FIG. 16A and FIG. 16B, an interlayer insulating film 18 is formed so as to cover the dot patterns 17 with using TEOS, for example, and the surface thereof is then planarized by CMP or the like.

Wirings and so forth in the second layer and thereafter are then formed by similar process steps, to thereby complete a semiconductor device.

According to the second embodiment as described above, the number of process steps can be reduced because the process step of forming the protective film 6 and any other processes associated therewith are not necessary.

Figure 17A:
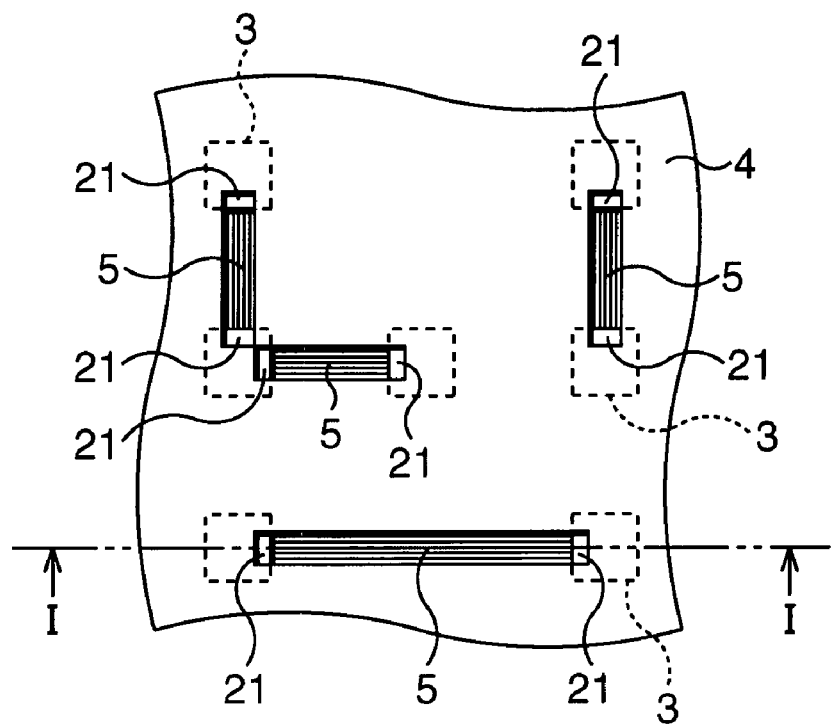
FIG. 17A is a plan view showing an exemplary in which a growth suppressive films 21 are formed.
Figure 17B:
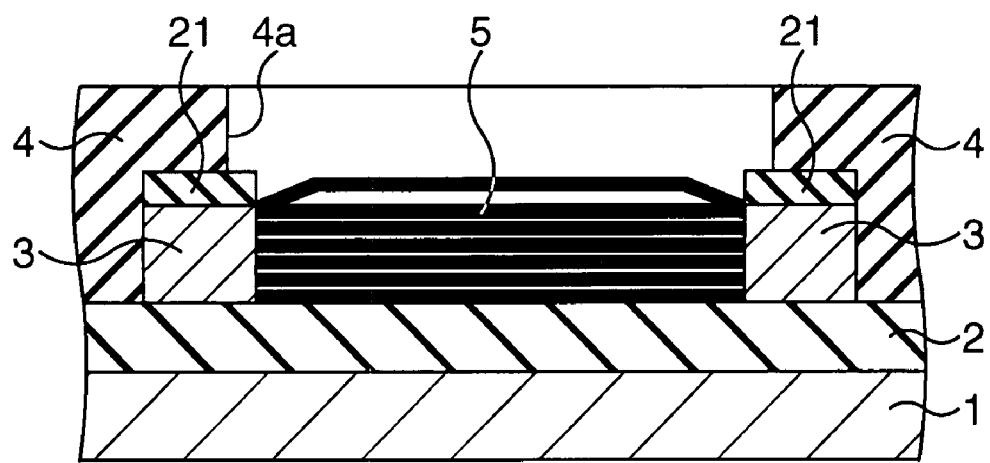
FIG. 17B is a sectional view taken along line I-I in FIG. 17A.

It is to be noted that, in the first embodiment, the carbon nanotubes 5 unnecessarily grown upward in the process of growing the carbon nanotubes 5 between the dot patterns 3; therefore, the unnecessary portions are removed, but it is also allowable to avoid the upward growth of the carbon nanotubes 5 in the process of growing the carbon nanotubes 5. For example, as shown in FIG. 17A and FIG. 17B, growth suppressive films 21 suppressing growth of the carbon nanotubes 5 may be formed on the dot patterns 3. As the growth suppressive film 21, either of a conductive film and an insulating film may be formed, so far as it will not be etched off together with the interlayer insulating film 4 in the process of forming the trenches 4a, and so far as it can suppress growth of the carbon nanotubes 5, or in other words, so far as it shows etching selectivity over the interlayer insulating film 4, and so far as it does now show any catalytic function for the carbon nanotubes. Examples of this sort of a conductive film include an Al film, a Ti film and a TiN film, and examples of this sort of an insulating film include a Si nitride film and an alumina film.

When such a growth suppressive film 21 is used, it is good enough to form source material films of the dot patterns 3 and the growth suppressive film 21 in this order, and then to pattern these films. When the via-plugs are formed, it is good enough, for example, to form the openings (via-holes) 7a in the interlayer insulating film 7, and then to form openings also in the growth suppressive film 21. When the openings are formed in the growth suppressive film 21, it is preferable to adopt conditions capable of preventing the interlayer insulating film 7 from being etched.

Figure 18A:
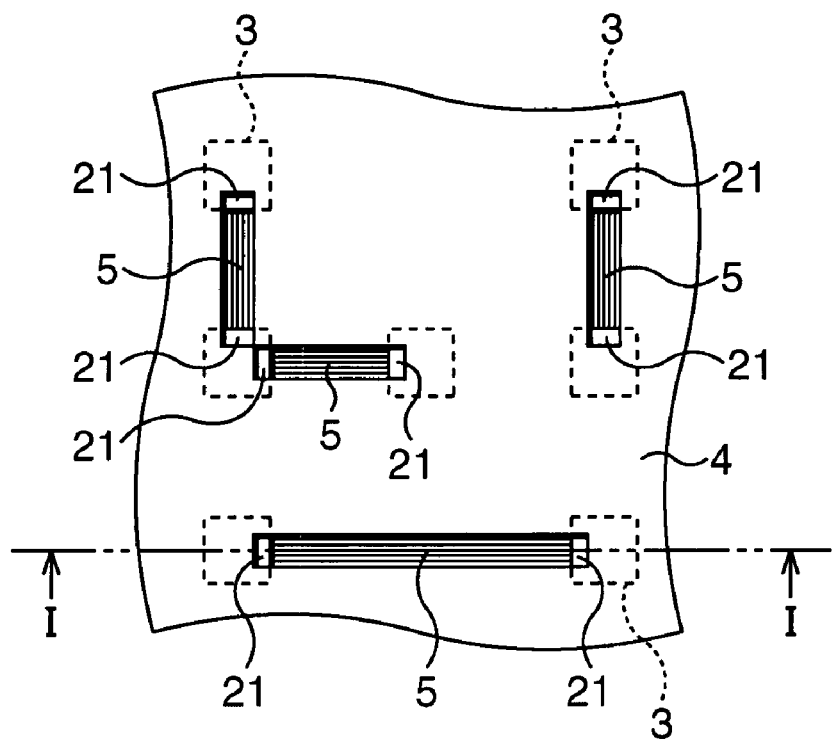
FIG. 18A is a plan view showing an exemplary in which dot patterns 23 having a reverse-tapered sectional geometry are formed.
Figure 18B:
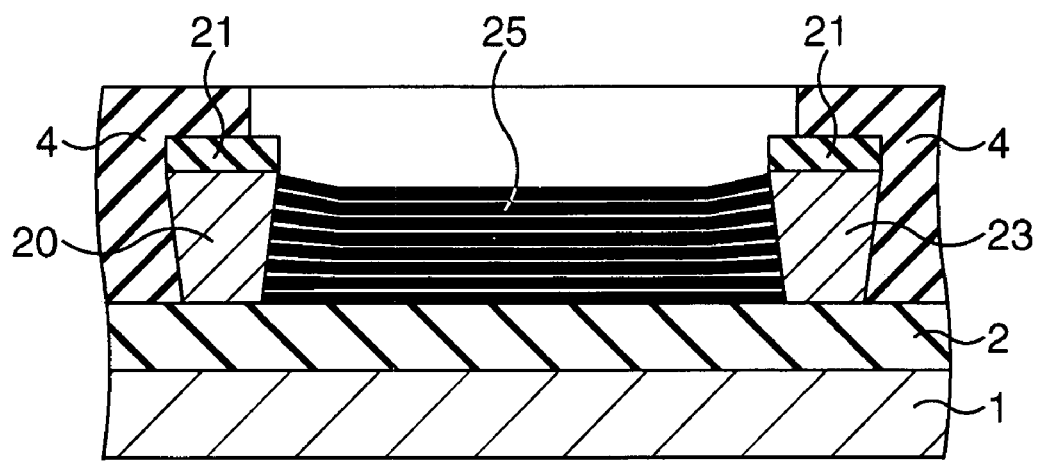
FIG. 18B is a sectional view taken along line I-I in FIG. 18A.

Moreover, when the growth suppressive film 21 is used, it is preferable, as shown in FIG. 18A and FIG. 18B, to make the sectional geometry of the dot patterns 23, which serve as the origins of growth of the carbon nanotube, reverse-tapered, that is, into a geometry narrowed towards the bottoms thereof. By using thus-shaped dot patterns 23, the carbon nanotubes 25 grown therebetween become less likely to swell out upward, and the process thereafter will further be simplified. Carbon nanotubes are likely to grow normal to the surface of a metal catalyst, but a part of which grows obliquely to the surface as shown in FIG. 4B. If the sectional geometry of the dot patterns is preliminarily made reverse-tapered, taking such properties into account, direction of growth of the carbon nanotubes can be controlled to the lateral or more downward direction, so that it is no more necessary to remove the portion swelled out upward in the later process. The reverse-tapered dot patterns as described above are effective also for a case where the growth suppressive layer is not used, but they are more effective for the case where the growth suppressive layer is used.

The reverse-tapered dot patterns described above can be formed by promoting etching in the lateral direction, while making re-adhesion on the side faces of the patterns less likely to occur during the etching, by controlling etching conditions for the source material film. They can be formed also by adopting a damascene process as described later, and by making openings for forming the dot patterns as having a forward-tapered sectional geometry.

Figure 19A:
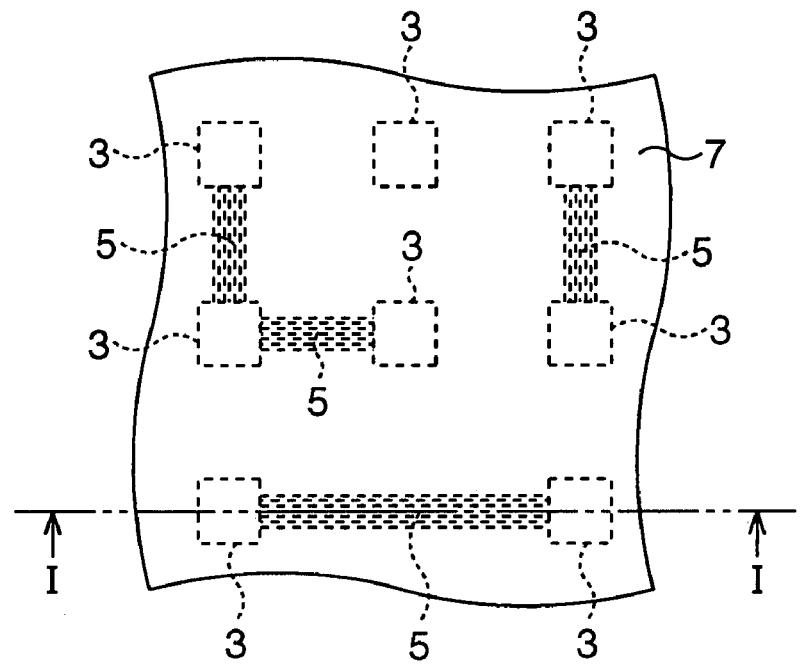
FIG. 19A is a plan view showing an exemplary in which anti-oxidation films 22 are formed.
Figure 19B:
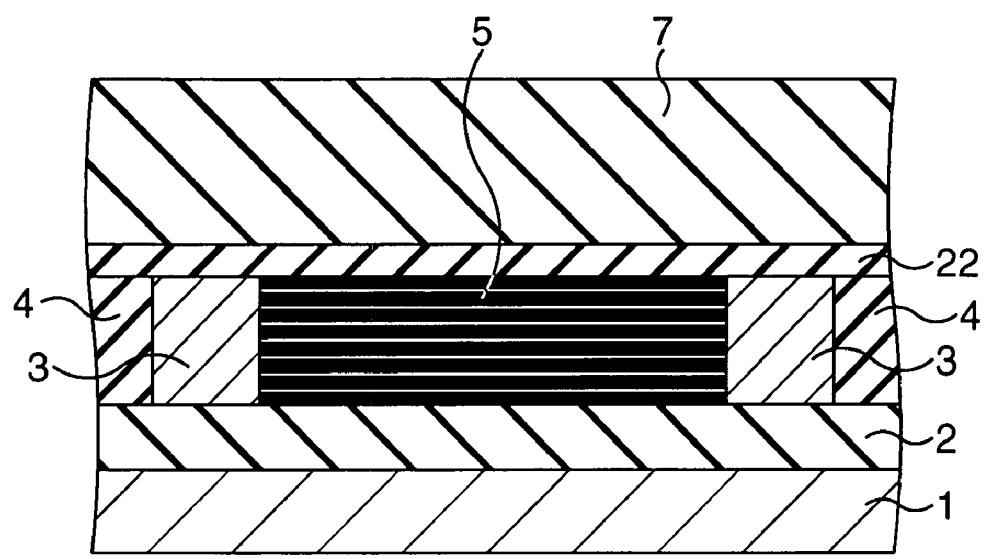
FIG. 19B is a sectional view taken along line I-I in FIG. 19A.

The carbon nanotubes 5 may undesirably oxidized, if the interlayer insulating film 7 is formed under an oxidative atmosphere while leaving the carbon nanotubes 5 exposed after the formation. In this case, it is preferable, as shown in FIG. 19A and FIG. 19B, to form an anti-oxidation film 22 before the interlayer insulating film 7 is formed. Examples of the anti-oxidation film 22 include those possibly formed by a CVD process under a reductive atmosphere, such as silicon nitride film, and insulating film (for example, alumina film, titania film, Si oxide film), and conductive film (Ti film, Al film), possibly formed by sputtering.

It is still also allowable to cover the surface of the dot patterns 3 with a film composed of a metal catalyst. A method of forming the film, and effects thereof will be explained referring to FIG. 20A and FIG. 20B to FIG. 23A and FIG. 23B.

Figure 20A:
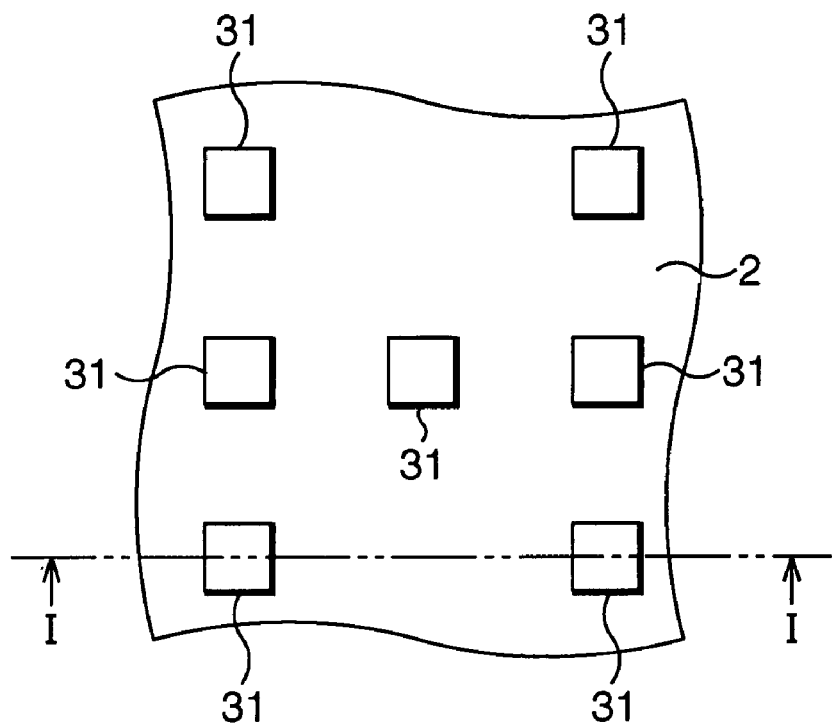
FIG. 20A is a plan view showing a method of covering the surface of dot patterns 3 with a metal catalyst film.
Figure 20B:
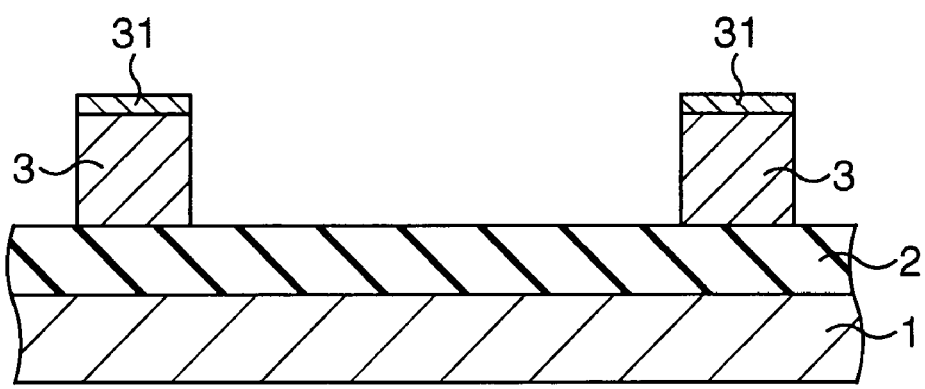
FIG. 20B is a sectional view taken along line I-I in FIG. 20A.

In the beginning, a source material film for the dot patterns 3 and a metal catalyst film are sequentially formed on the Si oxide film 2, and these films are then patterned, to thereby form the dot patterns 3 and a metal catalyst film 31, as shown in FIG. 20A and FIG. 20B. The metal catalyst film 31 is composed, for example, of Co, Ni, Fe or the like.

Figure 21A:
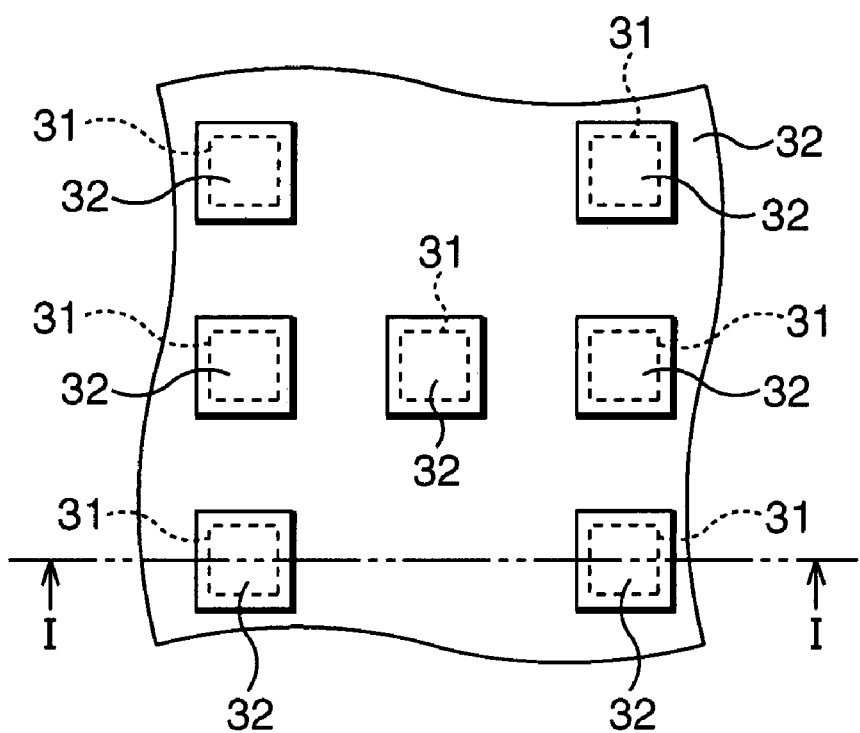
FIG. 21A is a plan view showing, as continued from FIG. 20A, the method of covering the surface of dot patterns 3 with a metal catalyst film.
Figure 21B:
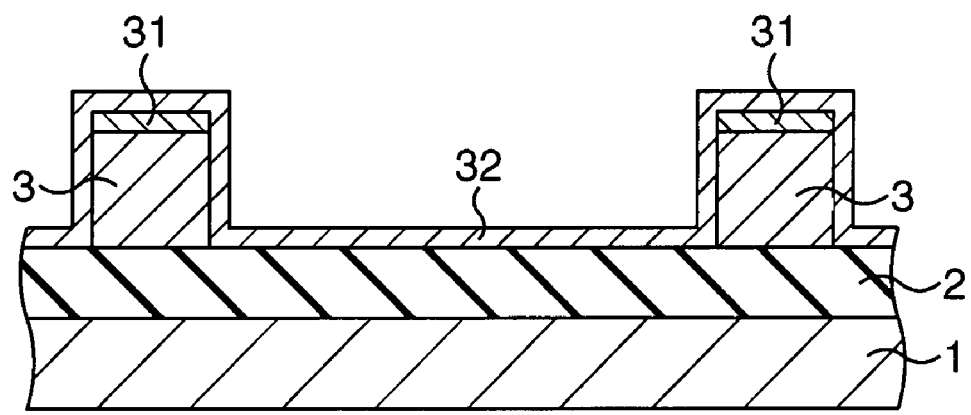
FIG. 21B is a sectional view taken along line I-I in FIG. 21A.

Next, as shown in FIG. 21A and FIG. 21B, a metal catalyst film 32 composed of the same metal with the metal catalyst film 31 is formed over the entire surface, by a CVD process, a PVD process, a plating process or the like.

Figure 22A:
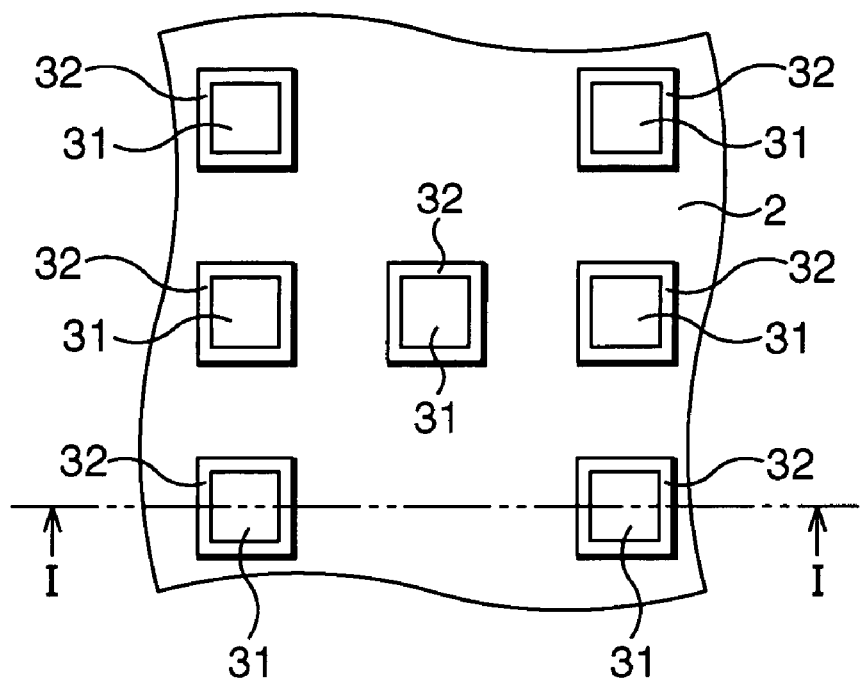
FIG. 22A is a plan view showing, as continued from FIG. 21A, the method of covering the surface of dot patterns 3 with a metal catalyst film.
Figure 22B:
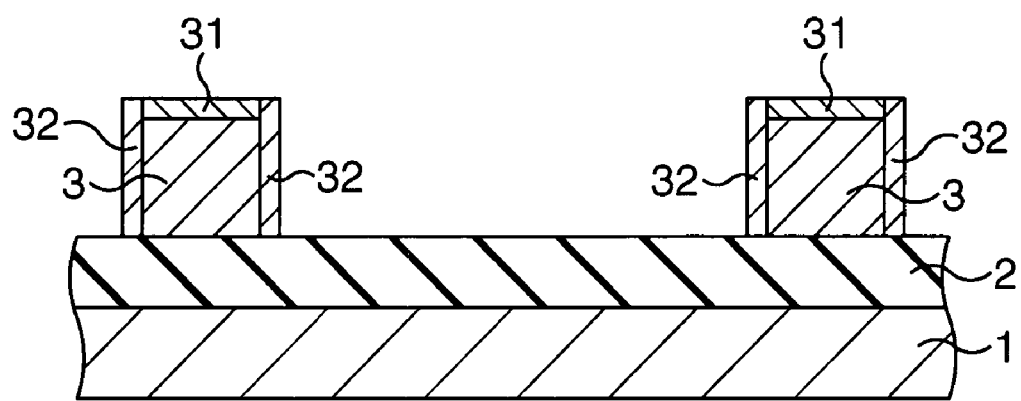
FIG. 22B is a sectional view taken along line I-I in FIG. 22A.

Next, as shown in FIG. 22A and FIG. 22B, the metal catalyst films 31 and 32 are anisotropically etched so as to leave them only at around the dot patterns 3.

Figure 23A:
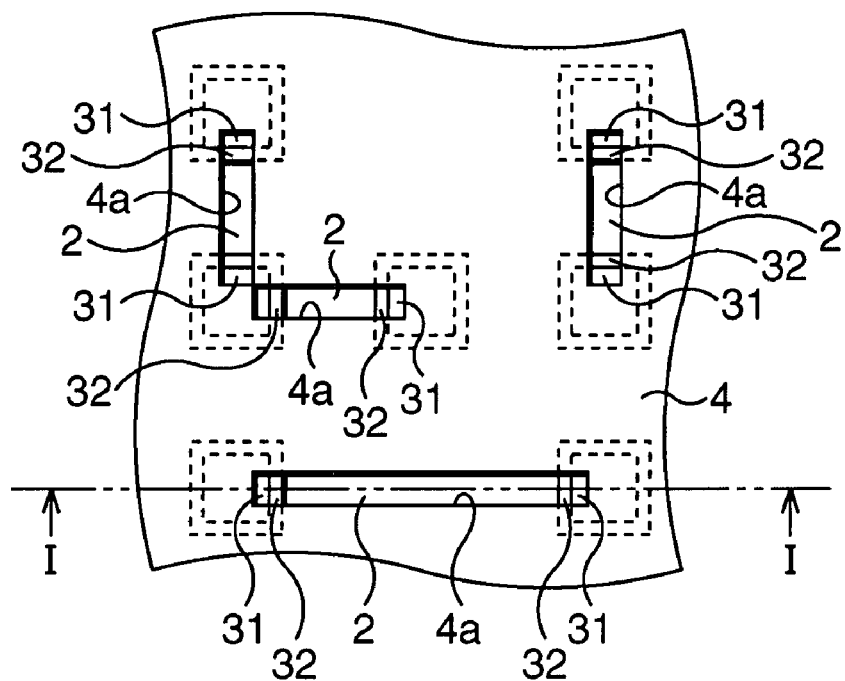
FIG. 23A is a plan view showing, as continued from FIG. 22A, the method of covering the surface of dot patterns 3 with a metal catalyst film.
Figure 23B:
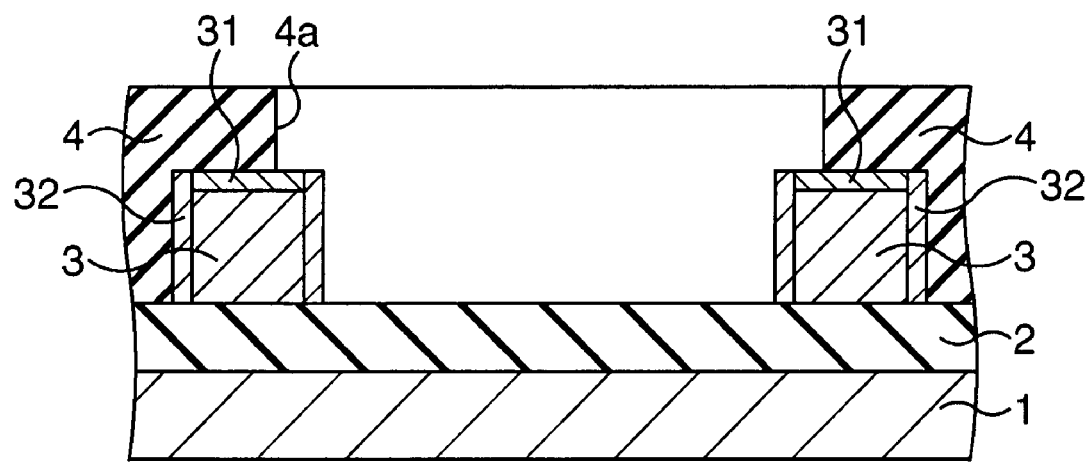
FIG. 23B is a sectional view taken along line I-I in FIG. 23A.

Thereafter, as shown in FIG. 23A and FIG. 23B, similarly to as in the first embodiment, the interlayer insulating film 4 is formed, and the trenches 4a are then formed.

According to this method, carbon nanotubes can grow as being originated from the metal catalyst films 31 and 32, so that the dot patterns 3 may be composed of any material other than a metal catalyst. Co, Ni and Fe can not be said as easy-to-etch, so that it is relatively difficult to shape the dot patterns 3 composed of any of these materials according to desired geometry. In contrast to this, use of the metal catalyst films 31 and 32 allows use of Al, TiN, insulating material and so forth, which are relatively easy-to-process, as the source materials for the dot patterns 3, so that desired geometry can more readily be obtained. Because the geometry of the dot patterns 3 affects the direction of growth of the carbon nanotubes originated therefrom, it is very valuable that the dot patterns 3 can be formed with an excellent accuracy. If the dot patterns 3 composed of Ti are formed, it is also made possible to obtain ohmic contact between the carbon nanotubes and the dot patterns 3.

Moreover, in a case where the metal catalyst films 31 and 32 are used, the dot patterns 3 may be composed of a plurality of layers. For example, a structure of the dot patterns 3 may be such as having an Al base, and a Ti film covering it. This structure can obtain advantages in that the use of Al makes the processing simpler, and at the same time in that the use of Ti ensures the ohmic contact.

The dot patterns can be formed not only by the formation of the source material film and the successive patterning as described above, but also by a damascene process. This method will be explained referring to FIG. 24A and FIG. 24B to FIG. 27A and FIG. 27B.

Figure 24A:
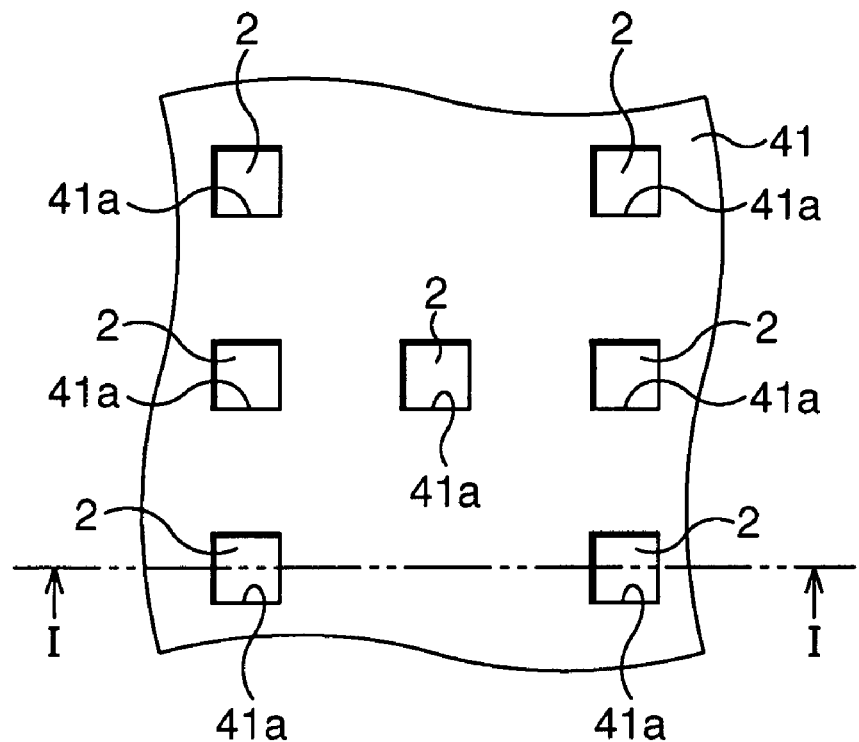
FIG. 24A is a plan view showing an exemplary in which a damascene process is adopted.
Figure 24B:
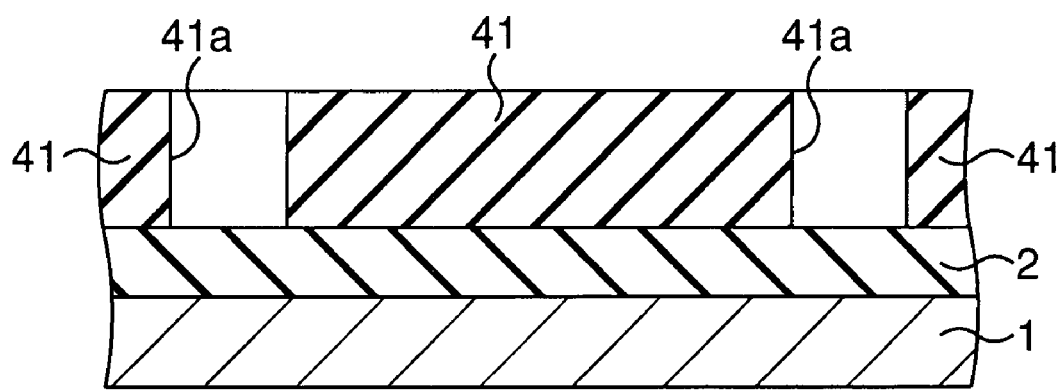
FIG. 24B is a sectional view taken along line I-I in FIG. 24A.

In this method, first, as shown in FIG. 24A and FIG. 24B, an insulating film 41 is formed over the Si oxide film 2, and openings 41a are then formed at positions destined for formation of dot patterns. The insulating film 41 is preferably composed of a material having an etching selectivity, for example, over the Si oxide film 2.

Figure 25A:
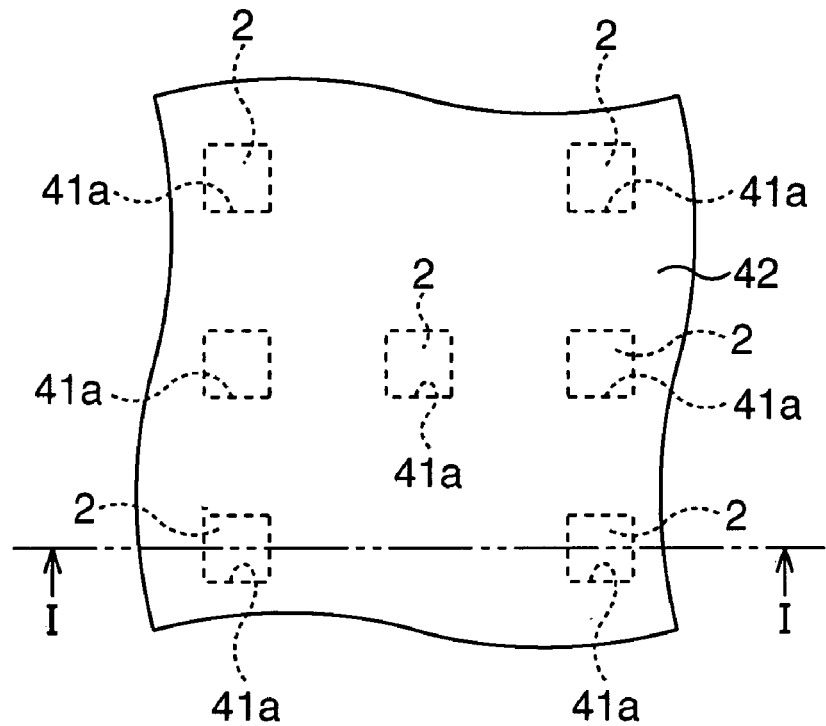
FIG. 25A is a plan view showing, as continued from FIG. 24A, the exemplary in which a damascene process is adopted.
Figure 25B:
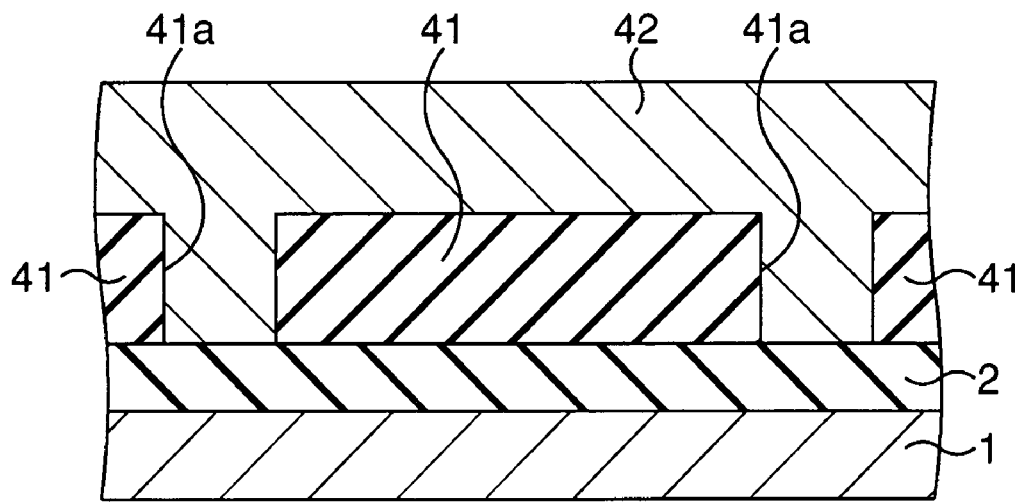
FIG. 25B is a sectional view taken along line I-I in FIG. 25A.

Next, as shown in FIG. 25A and FIG. 25B, a metal catalyst film 42 is formed over the entire surface, so as to fill up the openings 41a. The metal catalyst film 42 can be formed by a CVD process, a PVD process, a plating process or the like.

Figure 26A:
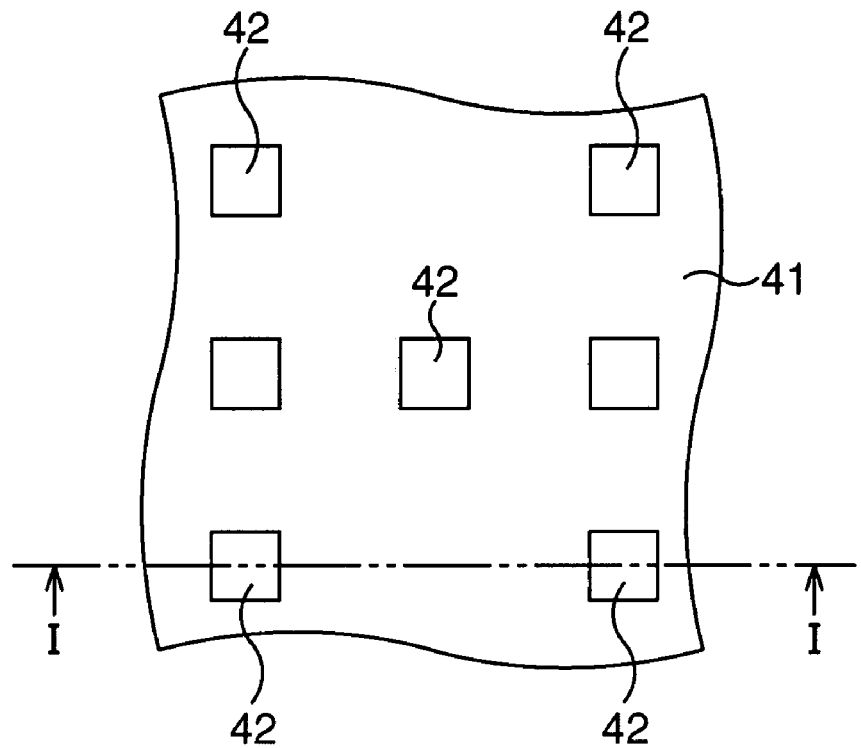
FIG. 26A is a plan view showing, as continued from FIG. 25A, the exemplary in which a damascene process is adopted.
Figure 26B:
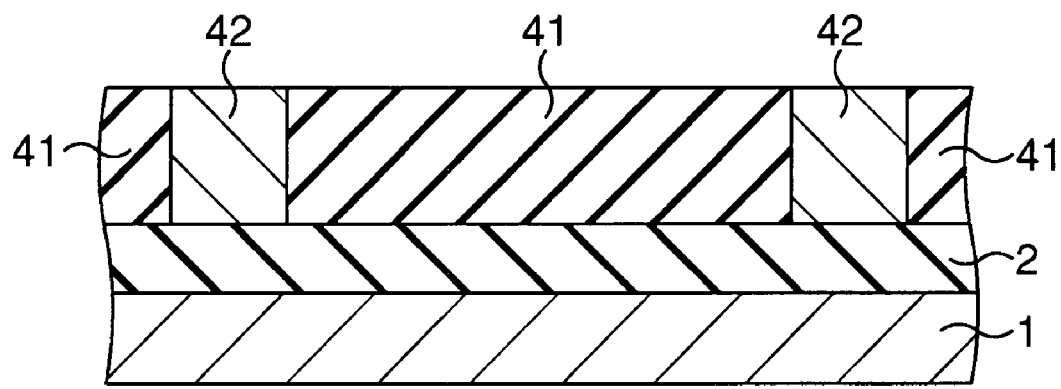
FIG. 26B is a sectional view taken along line I-I in FIG. 26A.

Next, as shown in FIG. 26A and FIG. 26B, the metal catalyst film 42 and the insulating film 41 are planarized by CMP or the like, so that a desired height of the film 42 is attained in the openings 41a. If the thickness of the insulating film 41 is preliminarily adjusted to the height of the dot patterns to be formed, the planarization can be terminated just when the insulating film 41 is exposes.

Figure 27A:
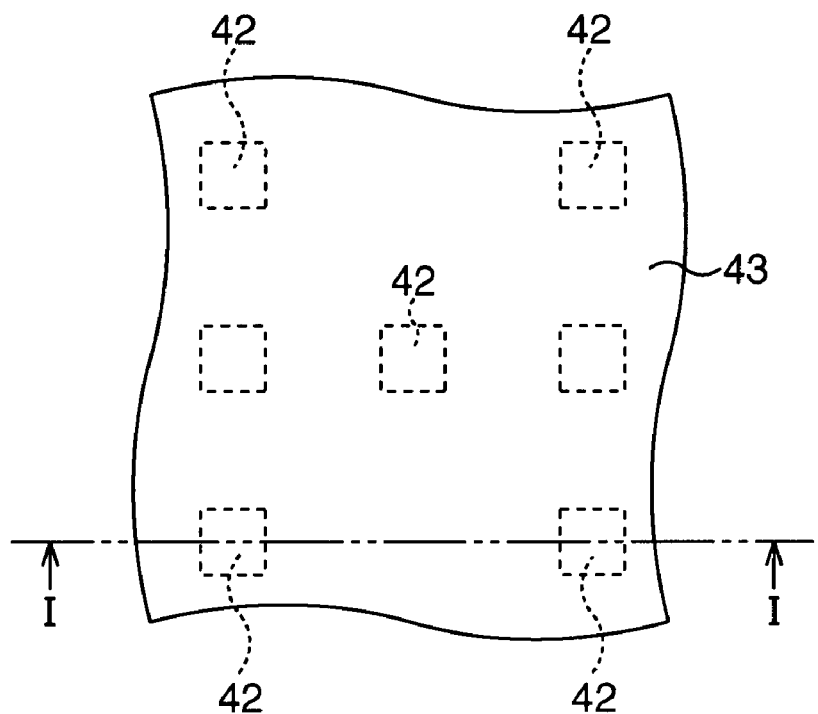
FIG. 27A is a plan view showing, as continued from FIG. 26A, the exemplary in which a damascene process is adopted.
Figure 27B:
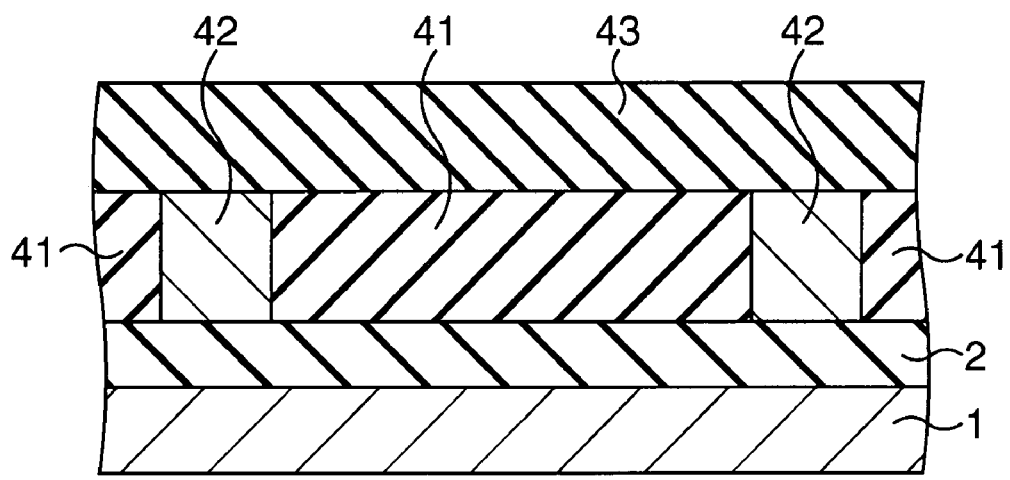
FIG. 27B is a sectional view taken along line I-I in FIG. 27A.

Thereafter, as shown in FIG. 27A and FIG. 27B, an interlayer insulating film 43 is formed over the entire surface, to thereby obtain a structure equivalent to that shown in FIG. 2A and FIG. 2B.

By adopting the damascene process as described above, the dot patterns having a desired geometry can be formed in a relatively easy manner, even when the materials such as Co, Ni, Fe or the like, which are relatively hard-to-etch materials, is used.

Figure 28:
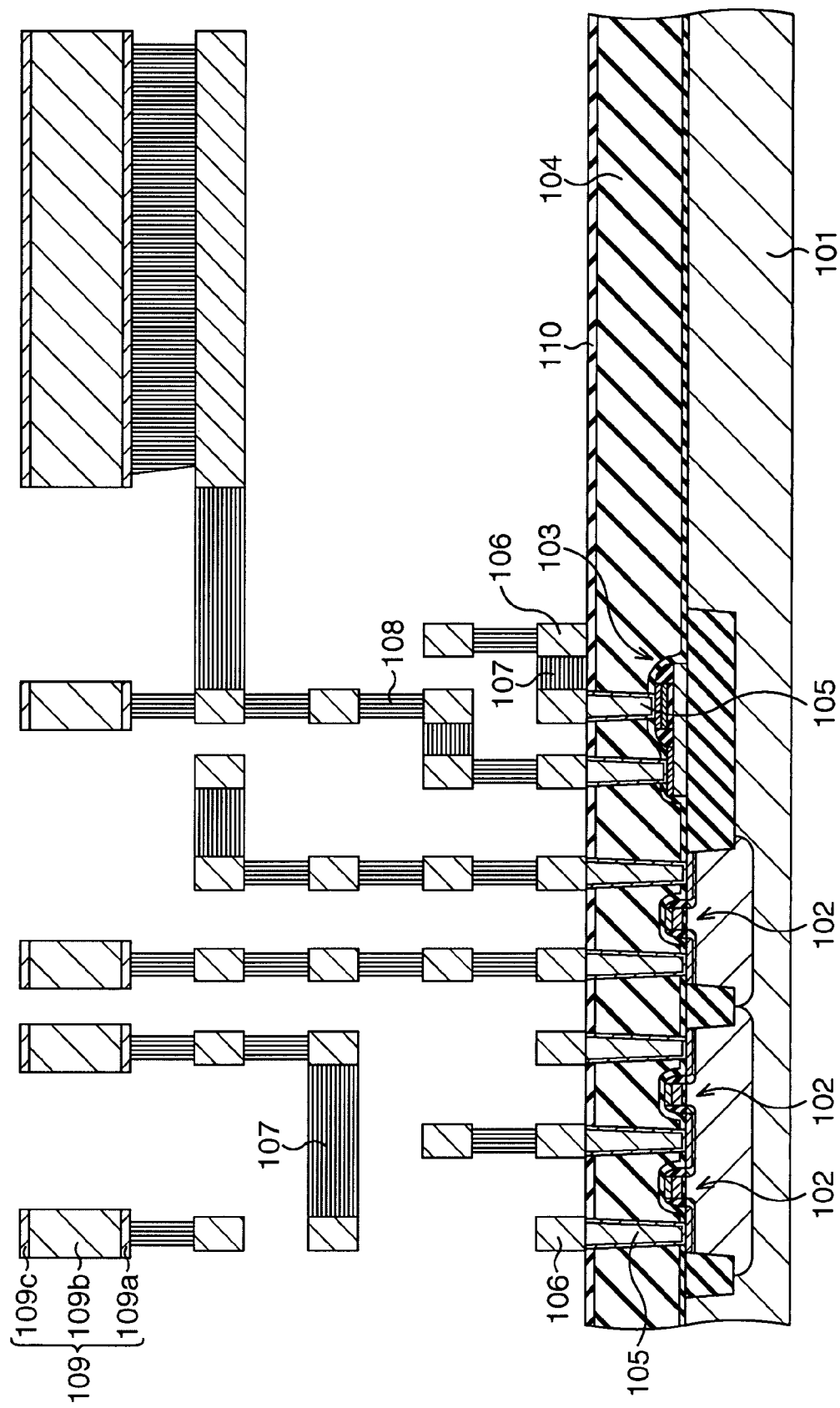
FIG. 28 is a sectional view showing an exemplary in which interlayer insulating films are removed.

In a case where the carbon nanotubes composing the wirings and the via-plugs have a sufficiently large strength, the interlayer insulating films are omissible between the wirings, as shown in FIG. 28. In other words, a plurality of origin patterns 106 containing metal catalyst and a plurality of wirings and the via-plugs 108 composed of the carbon nanotubes may be exposed. This structure can be obtained by constructing a stacked structure similar to that shown in FIG. 11, and then by carrying out isotropic wet etching using, for example, a hydrofluoric acid series chemical solution. It is, however, necessary to leave the interlayer insulating film 104 unremoved, so that it is preferable to form an etching stopper layer 110 composed of silicon nitride film or the like, so as to cover the interlayer insulating film 104.

Third Embodiment

Next, a third embodiment of the present invention will be explained. In this embodiment, a field effect transistor having a channel composed of zigzag-type carbon nanotubes will be formed. FIG. 29A and FIG. 29B to FIG. 40A and FIG. 40B are drawings sequentially showing process steps of a method of manufacturing a semiconductor device according to the third embodiment of the present invention. FIG. 29B to FIG. 40B are sectional views taken along line II-II in FIG. 29A to FIG. 40A, respectively.

Figure 29A:
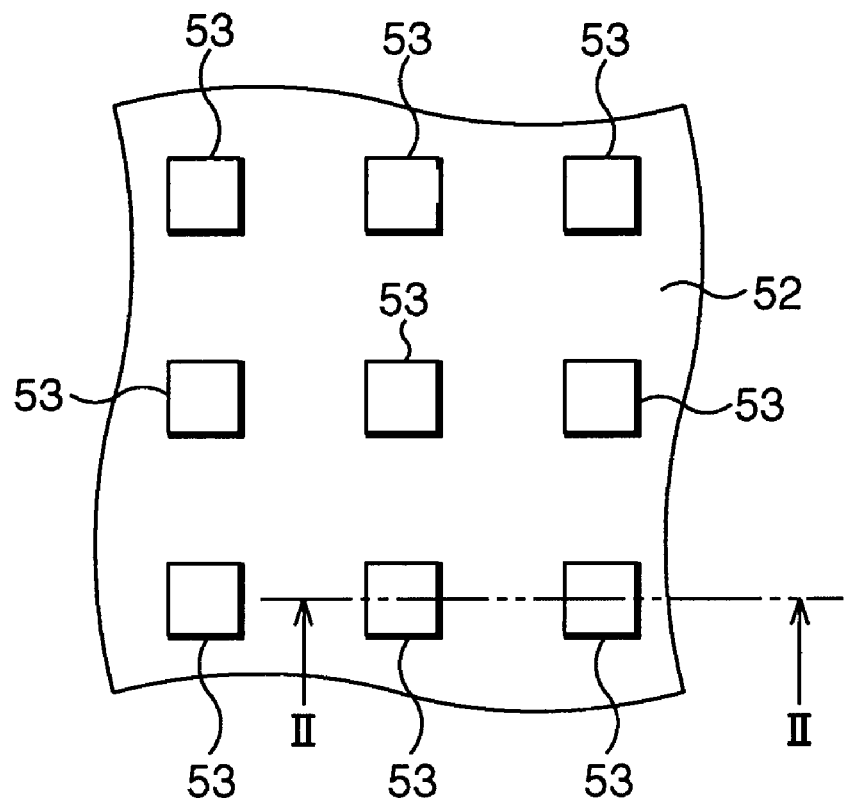
FIG. 29A is a plan view showing a method of manufacturing a semiconductor device according to a third embodiment of the present invention.
Figure 29B:
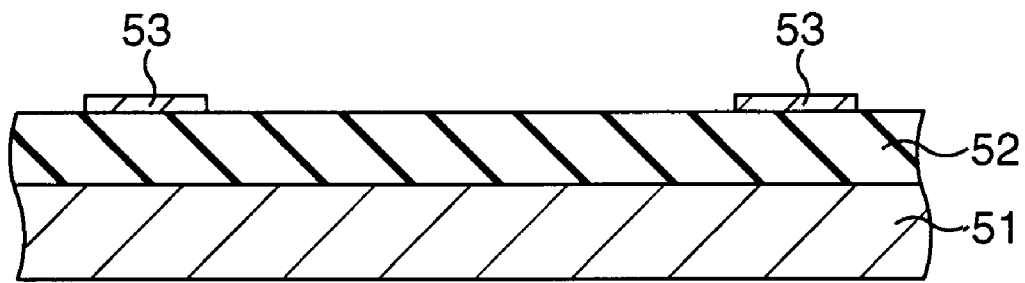
FIG. 29B is a sectional view taken along line II-II in FIG. 29A.

In the third embodiment, first, as shown in FIG. 29A and FIG. 29B, a Si oxide film 52 is formed on a semiconductor substrate 51 with using TEOS or the like. Next, on the Si oxide film 52, dot patterns 53 composed of a metal catalyst for the carbon nanotubes are formed. Examples of the metal catalyst include cobalt (Co), nickel (Ni), iron (Fe) and so forth. Positions of formation of the dot patterns 53 are adjusted to the sources and the drains of the transistors to be formed. Sectional geometry involving height and width, for example, of the dot patterns 53 is determined based on thickness of the channel of the transistor to be formed, density, and so forth.

Figure 30A:
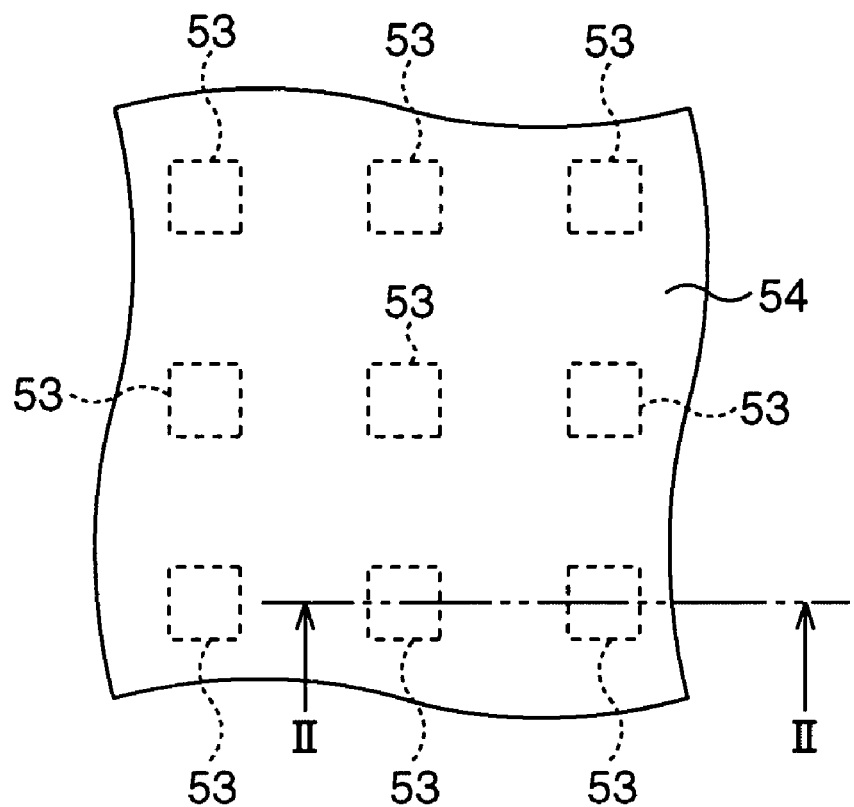
FIG. 30A is a plan view showing, as continued from FIG. 29A, the method of manufacturing a semiconductor device according to the third embodiment.
Figure 30B:
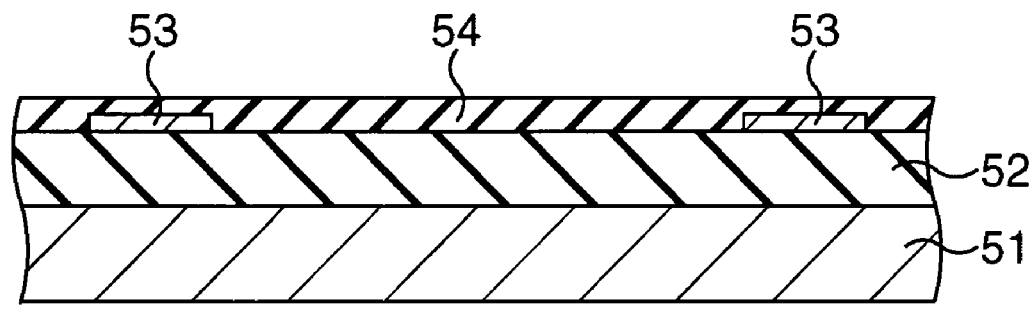
FIG. 30B is a sectional view taken along line II-II in FIG. 30A.

Next, as shown in FIG. 30A and FIG. 30B, an insulating film 54 covering the dot patterns 53 is formed with using TEOS or the like, and the surface of the film is then planarized by CMP or the like.

Figure 31A:
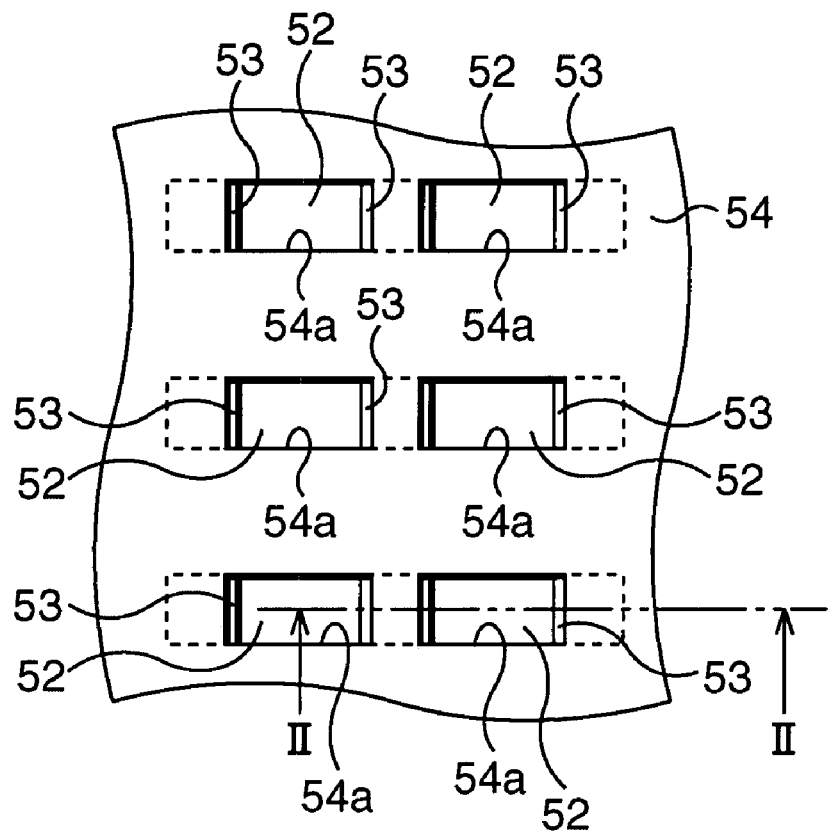
FIG. 31A is a plan view showing, as continued from FIG. 30A, the method of manufacturing a semiconductor device according to the third embodiment.
Figure 31B:
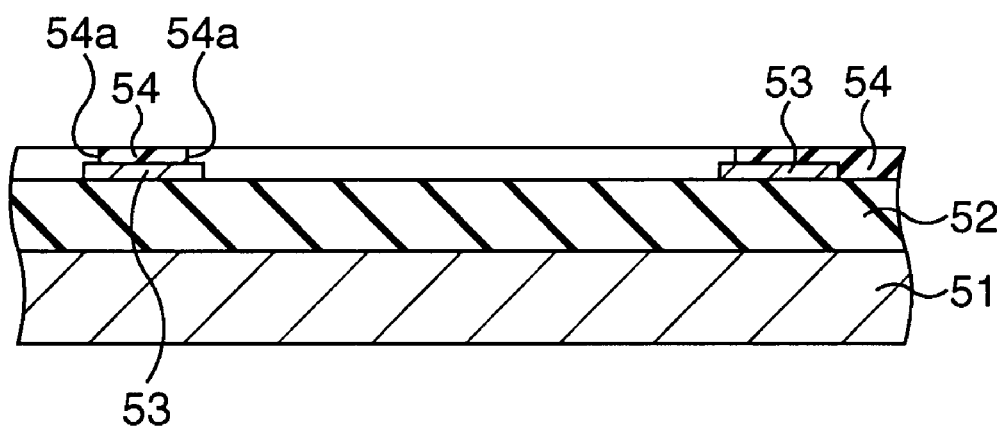
FIG. 31B is a sectional view taken along line II-II in FIG. 31A.

Thereafter, as shown in FIG. 31A and FIG. 31B, trenches 54a are formed in the insulating film 54 at positions destined for formation of the channel by dry etching, for example. This process is proceeded, similarly to as in the first embodiment, so as to expose the side faces of the dot patterns 53 from both ends of each trench 54a. This is because the side faces of the dot patterns 53 can serve as the origins of growth of the carbon nanotubes. In consideration of alignment accuracy in the process of forming the trenches 54a, it is preferable to adopt a design in which both ends of the trenches 54a fall on the top surfaces of the dot patterns 53. In other words, it is preferable to adopt a design in which the dot patterns 53 are slightly exposed out from the trenches 54. By adopting this design, the side faces of the dot patterns 3 can exactly be exposed, even if any slight misalignment occurs.

In a case where polymers or oxide of the metal catalysts adhere on the side faces of the dot patterns 53 after formation of the trenches 54a, it is preferable, as the occasion demands, to carry out isotropic etching (plasma treatment or wet treatment), similarly to as in the first embodiment.

Figure 32A:
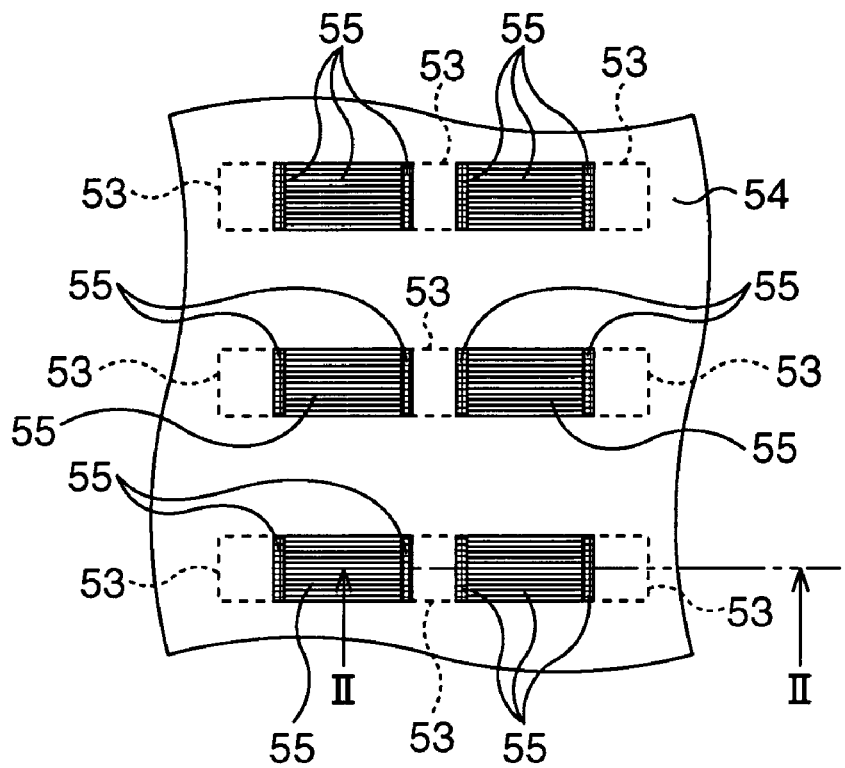
FIG. 32A is a plan view showing, as continued from FIG. 31A, the method of manufacturing a semiconductor device according to the third embodiment.
Figure 32B:
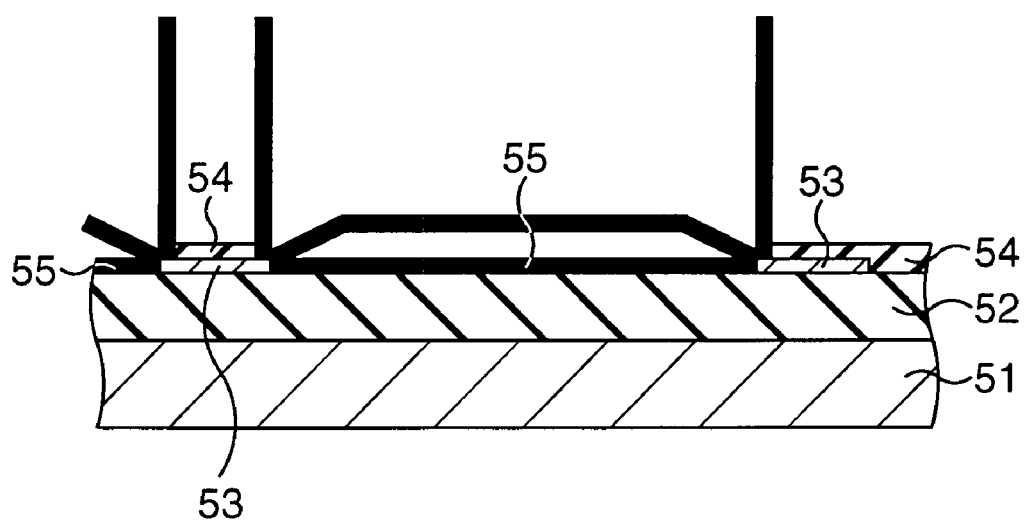
FIG. 32B is a sectional view taken along line II-II in FIG. 32A.

Thereafter, as shown in FIG. 32A and FIG. 32B, carbon nanotubes 55 are grown as being originated from the dot patterns 53 by a thermal CVD process or a plasma CVD process. In this process, a part of the carbon nanotubes 55 grows between the opposing dot patterns 53, but another part of the carbon nanotubes 55 grows upward from the top surfaces of the dot patterns 3.

Figure 33A:
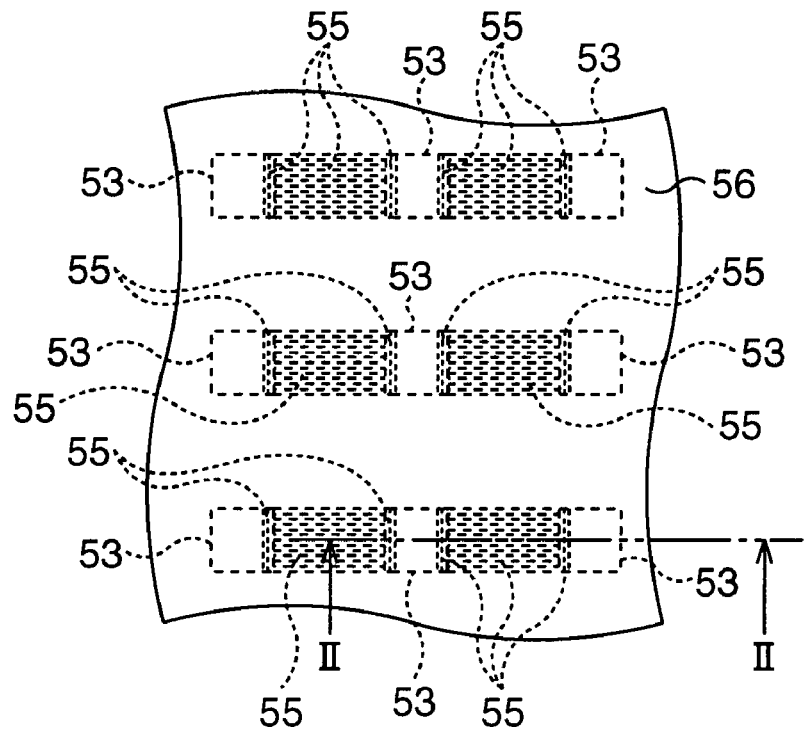
FIG. 33A is a plan view showing, as continued from FIG. 32A, the method of manufacturing a semiconductor device according to the third embodiment.
Figure 33B:
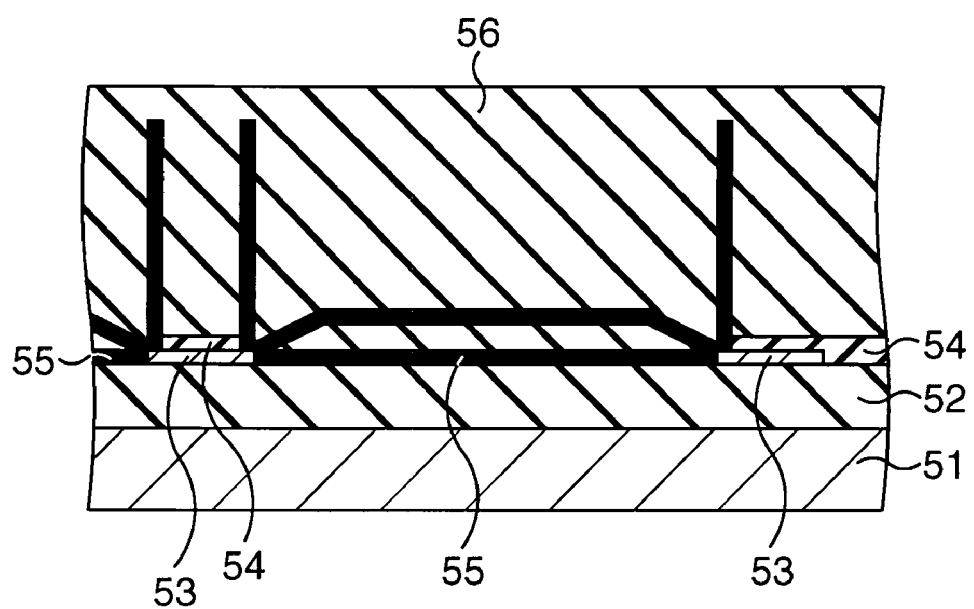
FIG. 33B is a sectional view taken along line II-II in FIG. 33A.

Next, as shown in FIG. 33A and FIG. 33B, a protective film 56 protecting the carbon nanotubes 55 from any damages possibly caused by CMP carried out later is formed. As the protective film 56, a silicon nitride film or a conductive film is preferably formed, in view of avoiding oxidation of the carbon nanotubes 55. It is also allowable to form an insulating film by sputtering. In view of paying more attention to oxidation of the carbon nanotubes 55, it is also allowable to use a silicon oxide film as the protective film 56.

The protective film 56 is omissible, if the carbon nanotubes 55 show enough strength against CMP.

Figure 34A:
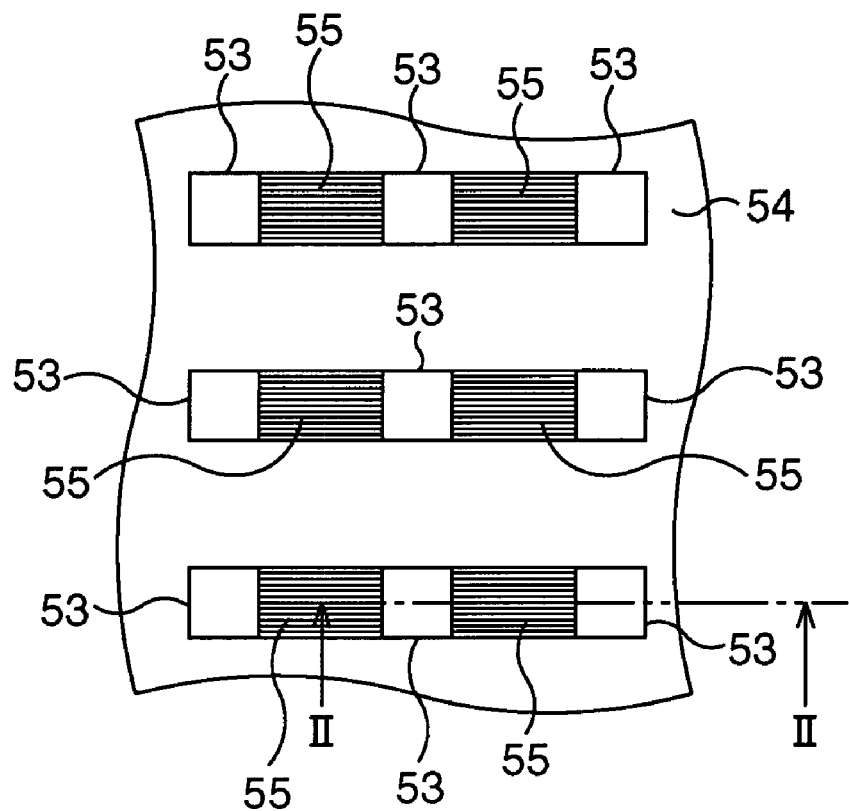
FIG. 34A is a plan view showing, as continued from FIG. 33A, the method of manufacturing a semiconductor device according to the third embodiment.
Figure 34B:
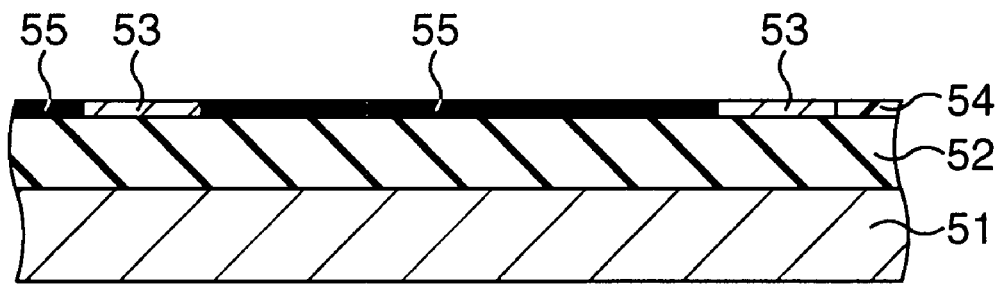
FIG. 34B is a sectional view taken along line II-II in FIG. 34A.

Next, as shown in FIG. 34A and FIG. 34B, the insulating film 54, the carbon nanotubes 55 and the protective film 56 are removed by CMP or the like, until the dot patterns 53 are exposed. In a case where it is anticipated that the protective film 56 remained in the gap between the carbon nanotubes 55 may adversely affect transistor characteristics, the residual protective film 56 is preferably removed by wet treatment using a hydrofluoric acid series chemical solution.

Figure 35A:
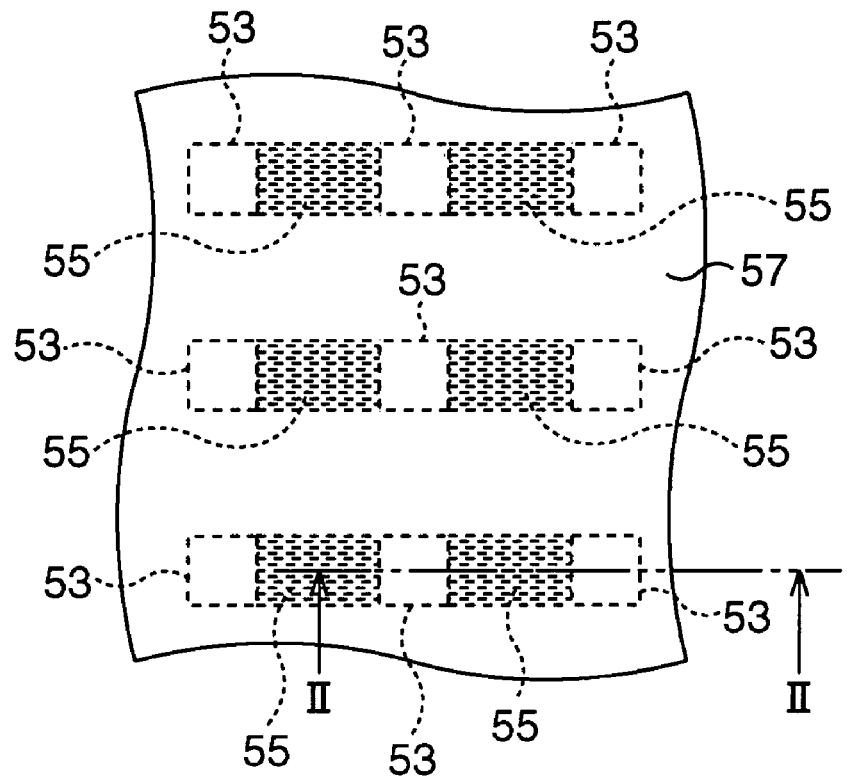
FIG. 35A is a plan view showing, as continued from FIG. 34A, the method of manufacturing a semiconductor device according to the third embodiment.
Figure 35B:
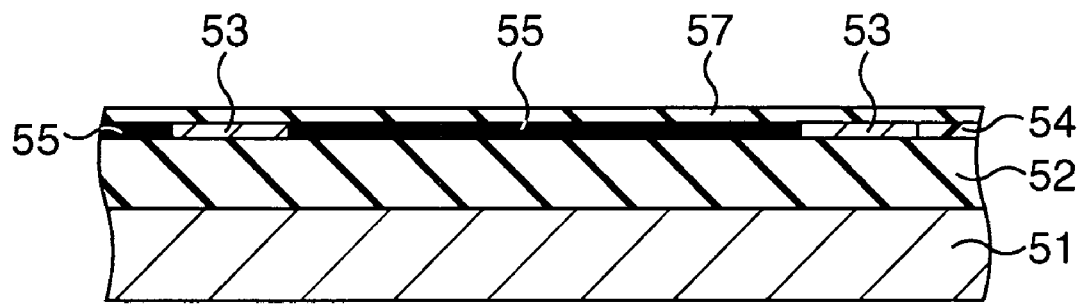
FIG. 35B is a sectional view taken along line II-II in FIG. 35A.

Next, as shown in FIG. 35A and FIG. 35B, a gate insulating film 57 is formed over the entire surface by a CVD process, for example.

Figure 36A:
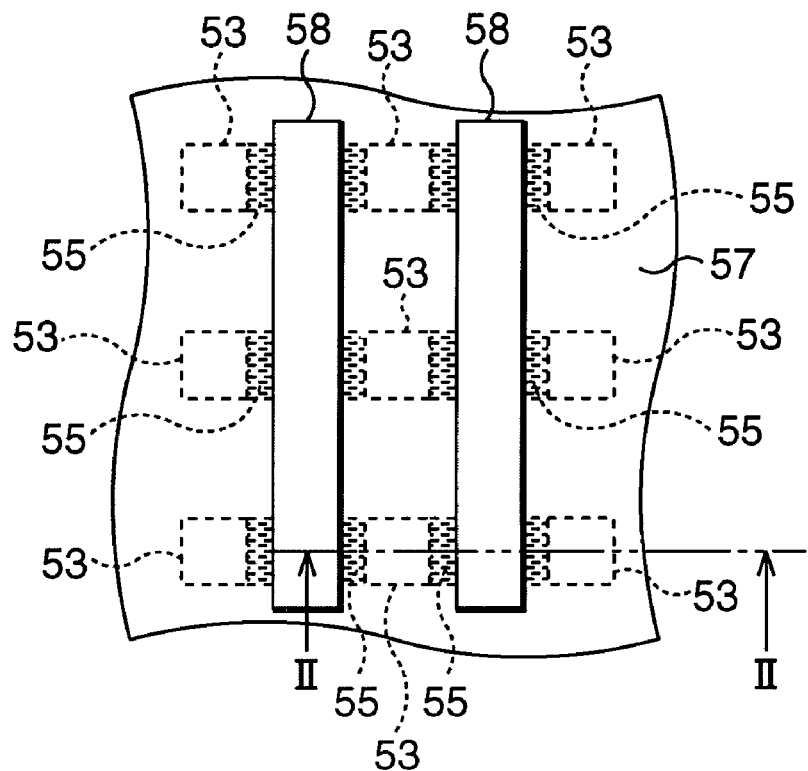
FIG. 36A is a plan view showing, as continued from FIG. 35A, the method of manufacturing a semiconductor device according to the third embodiment.
Figure 36B:
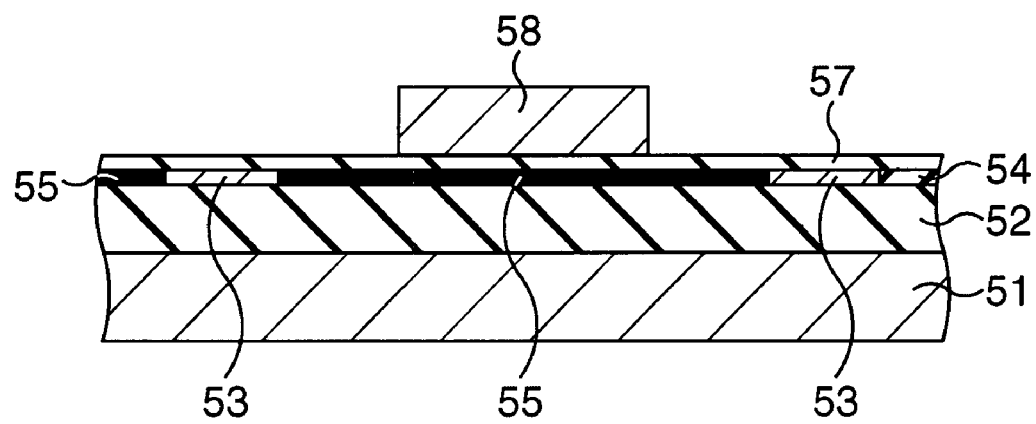
FIG. 36B is a sectional view taken along line II-II in FIG. 36A.

Thereafter, as shown in FIG. 36A and FIG. 36B, gate electrodes 58 are formed on the gate insulating film 57. Width of the gate electrodes 58 (gate length) may be shorter, or may be longer than length of the carbon nanotubes composing the channel.

Figure 37A:
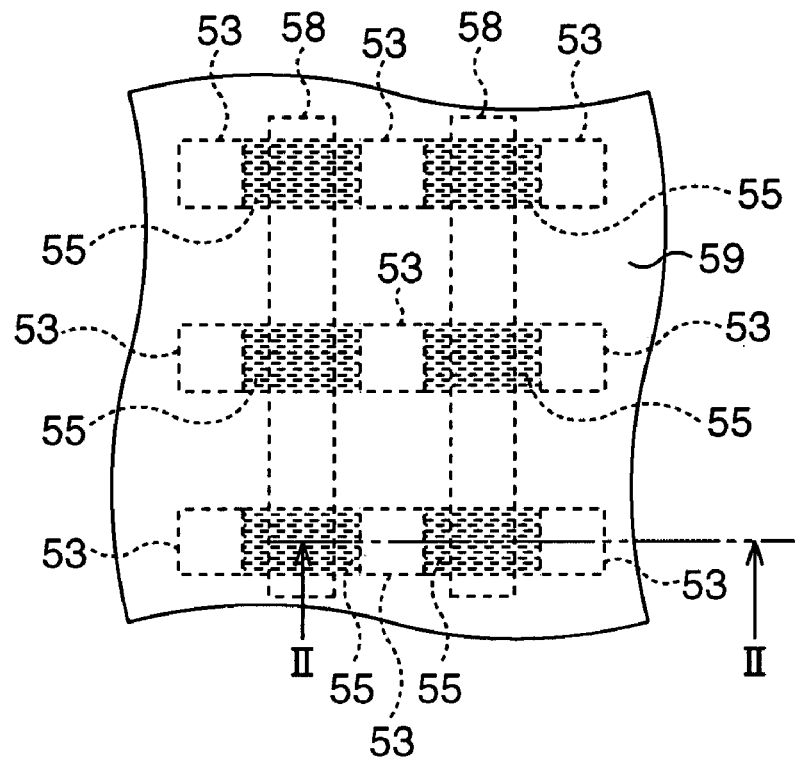
FIG. 37A is a plan view showing, as continued from FIG. 36A, the method of manufacturing a semiconductor device according to the third embodiment.
Figure 37B:
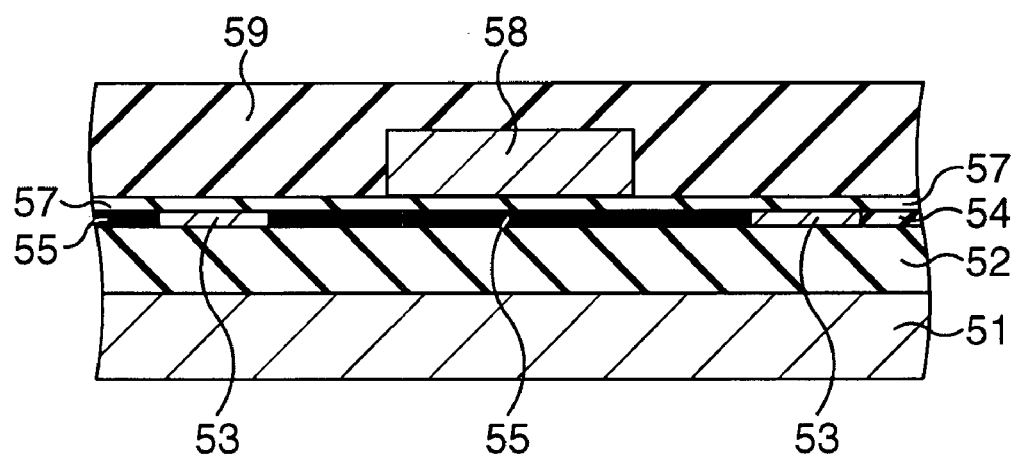
FIG. 37B is a sectional view taken along line II-II in FIG. 37A.

Next, as shown in FIGS. 37A and 37B, an interlayer insulating film 59 covering the gate electrode 58 is formed with using TEOS or the like.

Figure 38A:
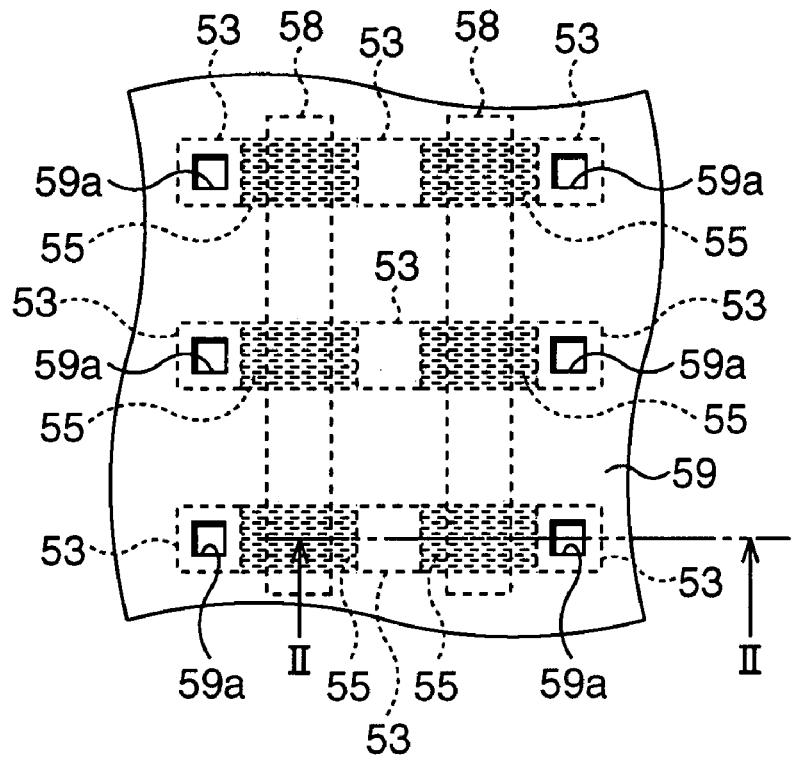
FIG. 38A is a plan view showing, as continued from FIG. 37A, the method of manufacturing a semiconductor device according to the third embodiment.
Figure 38B:
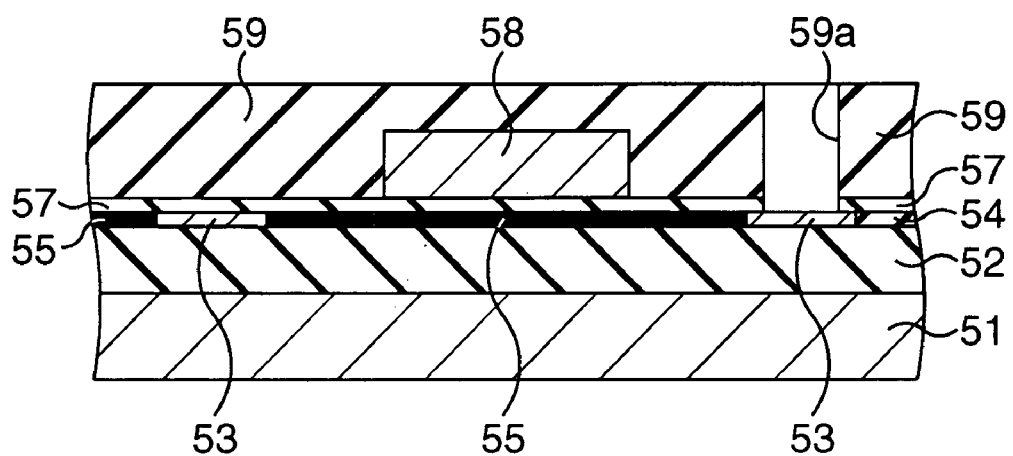
FIG. 38B is a sectional view taken along line II-II in FIG. 38A.

Next, as shown in FIG. 38A and FIG. 38B, openings (via-holes) 59a are formed in the interlayer insulating film 59, so as to reach the dot patterns 53. It is, however, not necessary to form the openings 59a on all of the dot patterns.

Figure 39A:
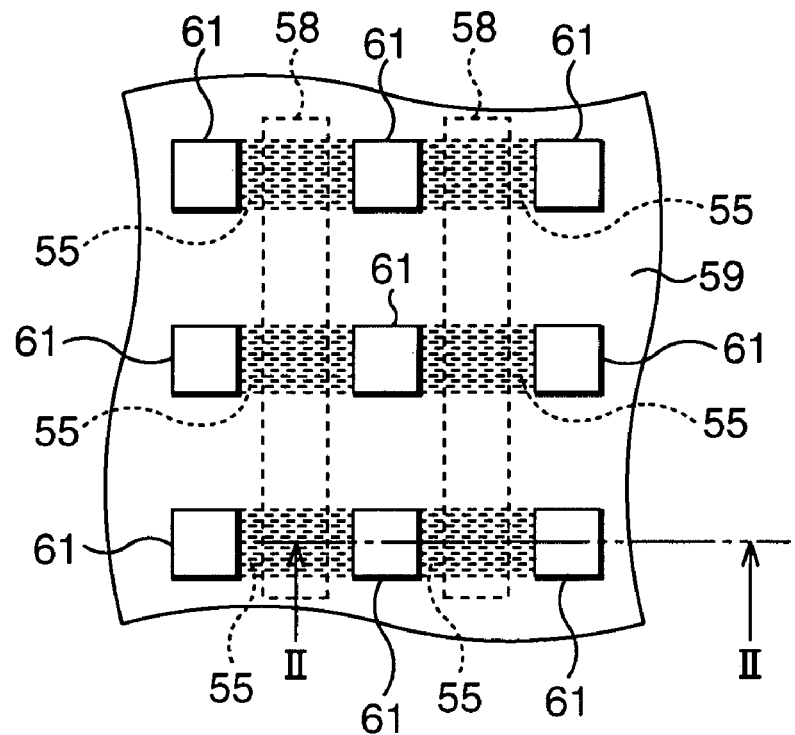
FIG. 39A is a plan view showing, as continued from FIG. 38A, the method of manufacturing a semiconductor device according to the third embodiment.
Figure 39B:
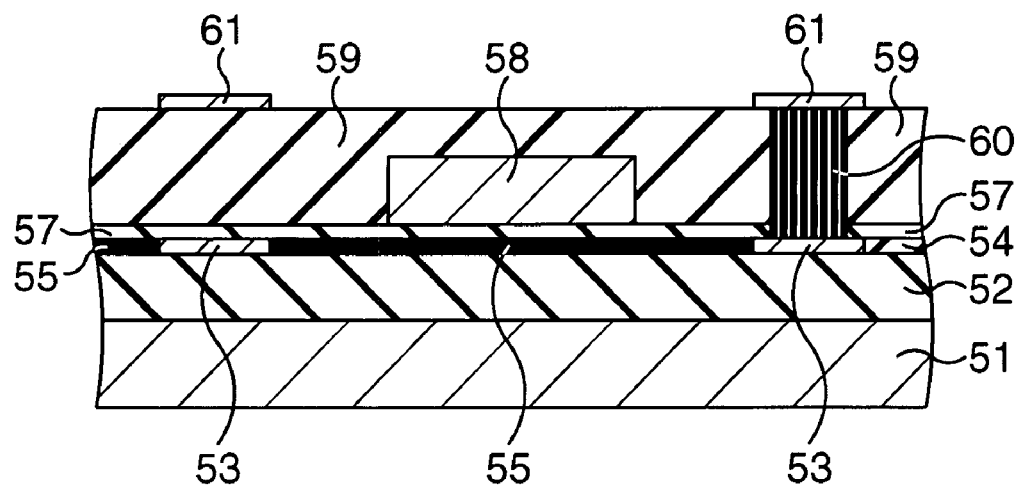
FIG. 39B is a sectional view taken along line II-II in FIG. 39A.

Next, as shown in FIG. 39A and FIG. 39B, carbon nanotubes 60 are vertically grown by a thermal CVD process or a plasma CVD process, as being originated from the dot patterns 53. Thereafter, portions of the carbon nanotubes 60 projected out from the interlayer insulating film 59 are removed by CMP or the like. As a consequence, a structure having the openings 59a filled with the via-plugs is obtained. Next, on the interlayer insulating film 59, dot patterns 61 composed of a metal catalyst for the carbon nanotubes are formed. Positions of formation of the dot patterns 61 are adjusted to the sources and the drains of the transistors to be formed. In this process, a part of the dot patterns 61 may be formed on the carbon nanotubes 60.

Figure 40A:
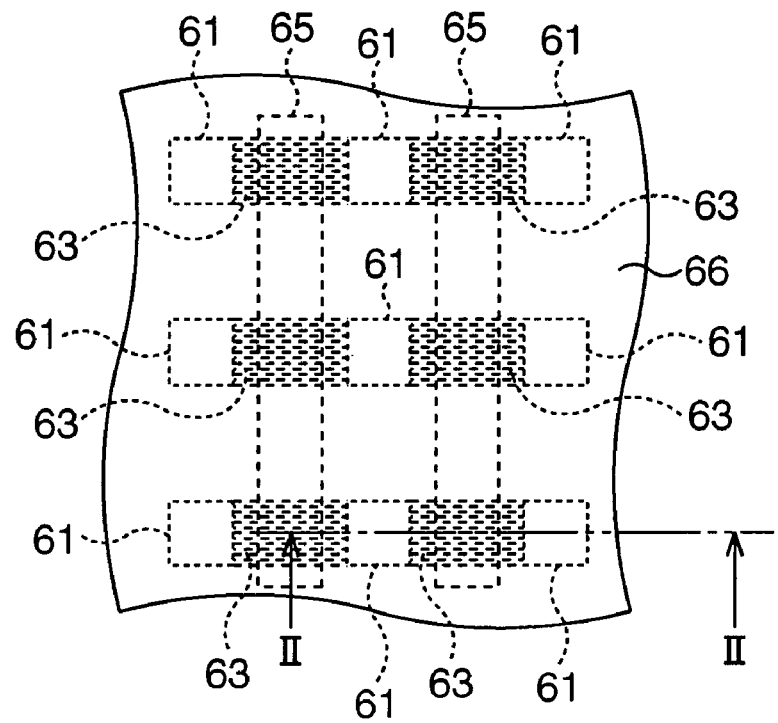
FIG. 40A is a plan view showing, as continued from FIG. 39A, the method of manufacturing a semiconductor device according to the third embodiment.
Figure 40B:
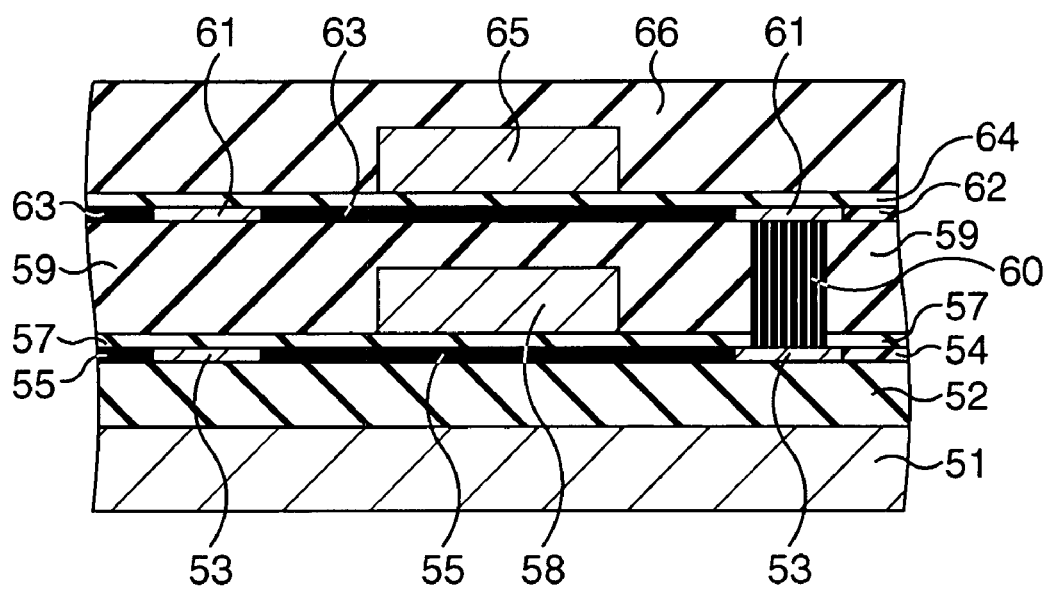
FIG. 40B is a sectional view taken along line II-II in FIG. 40A.

Next, processes similar to those for forming the lower field effect transistors are carried out. More specifically, as shown in FIG. 40A and FIG. 40B, an insulating film 62 is formed, trenches are formed therein, carbon nanotubes 63 are grown in the trenches, these are planarized, gate insulating films 64 are formed, and gate electrodes 65 are formed thereon. An interlayer insulating film 66 covering the gate electrodes 65 is then formed. Thereafter, wirings and so forth are formed to thereby complete a semiconductor device.

According to the third embodiment as described above, the field effect transistors having the channels composed of the carbon nanotubes can readily be formed at desired positions with an excellent accuracy. Unlike formation on the surface of a Si substrate, they can be formed on various films, so that a plurality of field effect transistors can be arranged side by side, not only in the direction in parallel with the surface of the substrate, but also in the vertical direction.

Figure 41:
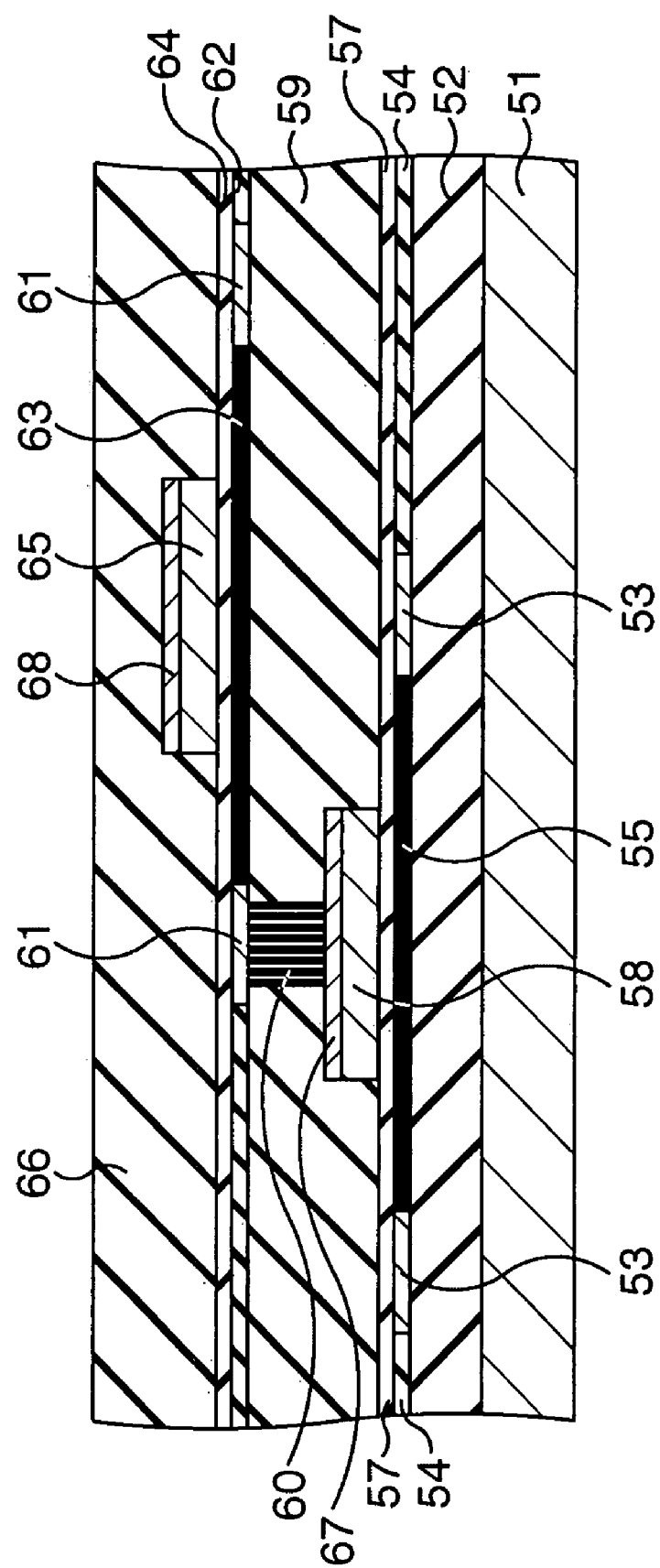
FIG. 41 is a sectional view showing an exemplary in which a metal catalyst layer 67 is formed on a gate electrode 58.
Figure 42:
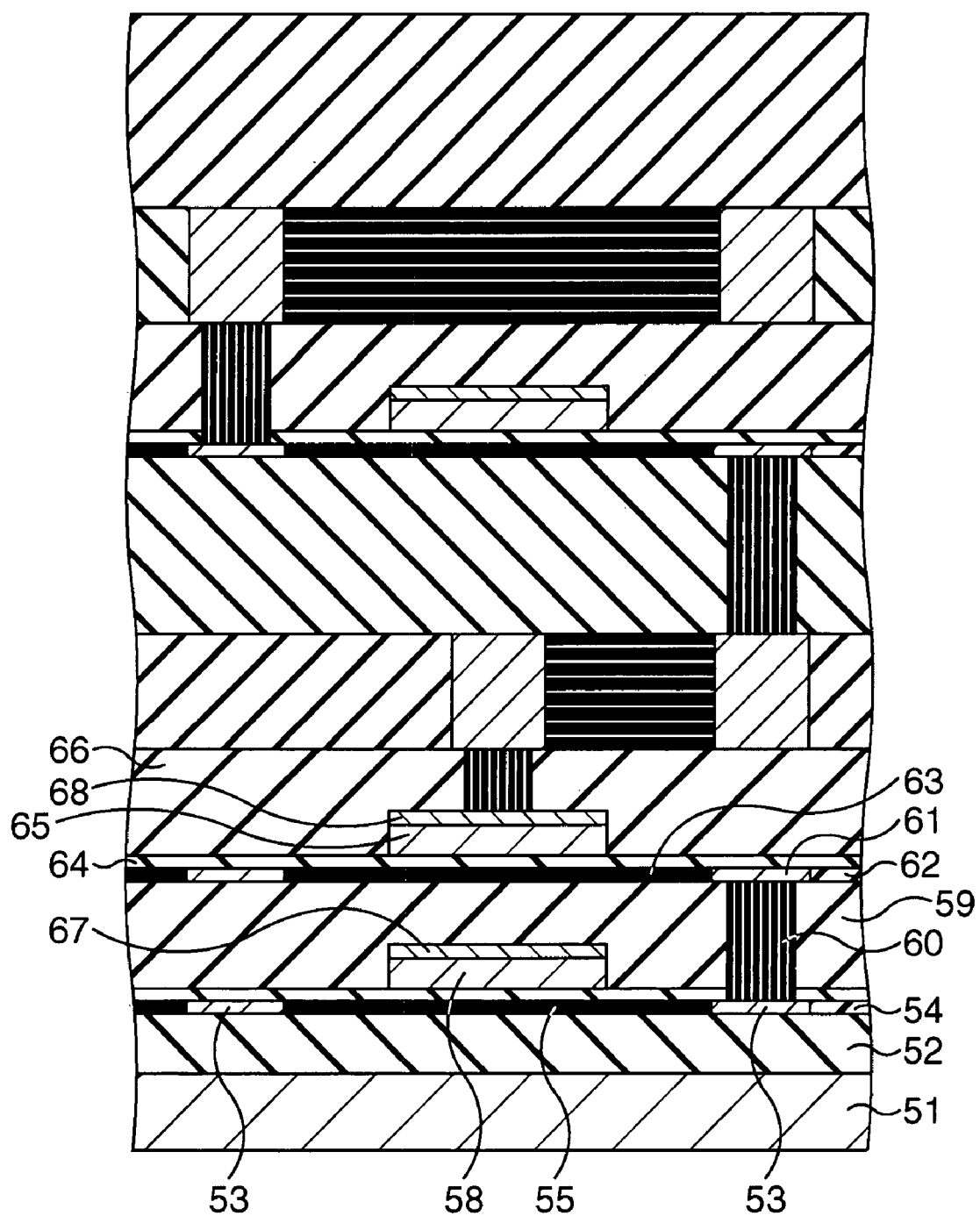
FIG. 42 is a sectional view showing a semiconductor device in which a metal catalyst layer 67 is formed on a gate electrode 58.

It is also allowable, as shown in FIG. 41, to form a metal catalyst layer 67 on the gate electrode 58, and to allow the carbon nanotubes 60 to grow thereon. By adopting this structure and this method, the carbon nanotubes can be used also for wirings between the gates and the sources/drains. In this case, it is preferable to form a metal catalyst layer 68 on the gate electrodes 65 of the upper transistors, and to connect them with further upper electrodes and wirings, using the carbon nanotubes. A sectional structure of the semiconductor device adopting this sort of method is shown in FIG. 42, for example.

Fourth Embodiment

Next, a fourth embodiment of the present invention will be explained. FIG. 43A and FIG. 43B to FIG. 45A and FIG. 45B are drawings sequentially showing process steps of a method of manufacturing a semiconductor device according to the fourth embodiment of the present invention. FIG. 43B to FIG. 45B are sectional views, taken along line II-II in FIG. 43A to FIG. 45A, respectively.

Figure 43A:
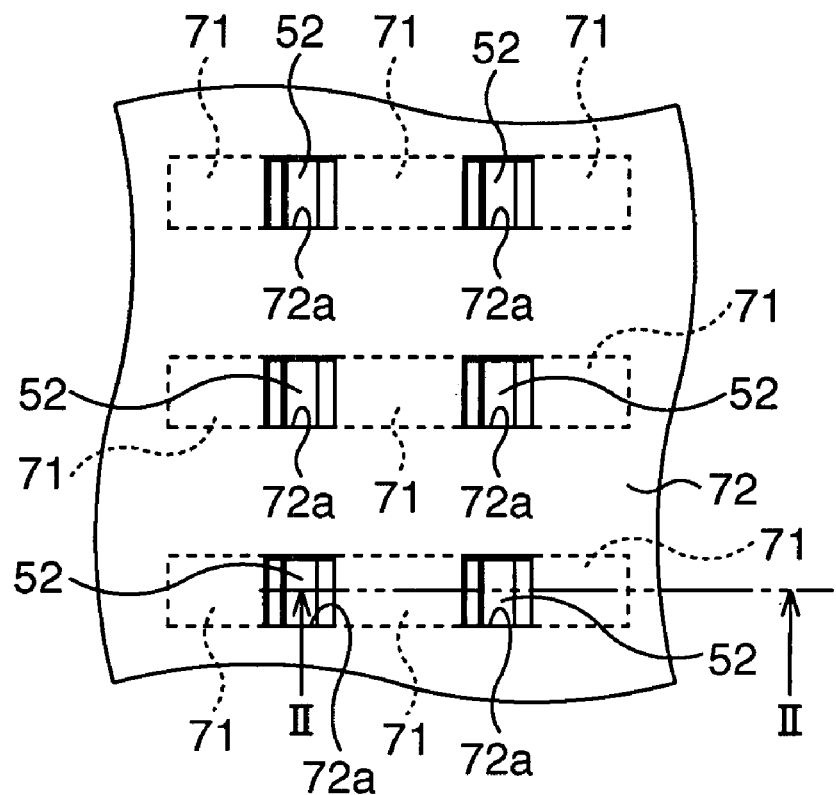
FIG. 43A is a plan view showing a method of manufacturing a semiconductor device according to a fourth embodiment of the present invention.
Figure 43B:
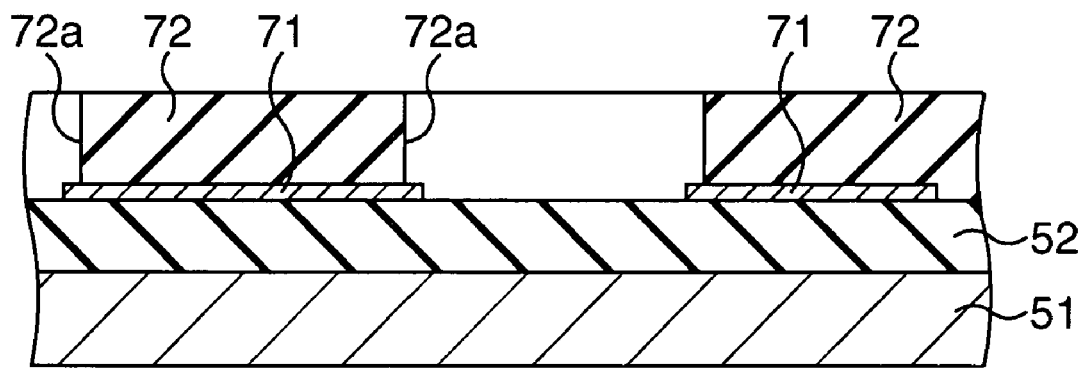
FIG. 43B is a sectional view taken along line II-II in FIG. 43A.

In the fourth embodiment, as shown in FIG. 43A and FIG. 43B, a Si oxide film 52 is formed on a semiconductor substrate 51, and dot patterns 71 composed of a metal catalyst for carbon nanotubes are formed on the Si oxide film 52. Positions of formation of the dot patterns 71 are adjusted to the sources and the drains of transistors to be formed. Plan geometry of the dot patterns 53 is set larger than that of the finally remained patterns. Next, an insulating film 72 covering the dot patterns 71 is formed with using TEOS or the like, and the surface of the film is then planarized by CMP or the like. Thereafter, trenches 72a are formed in the insulating film 72 by dry etching, for example, at the positions destined for formation of the channels. In this process, similarly to as in the third embodiment, the trenches 72 are formed so that the side faces of the dot patterns 71 are exposed on both ends of the trenches 72a, and so that the both ends of the trenches 72a fall on the top surfaces of the dot patterns 71.

Figure 44A:
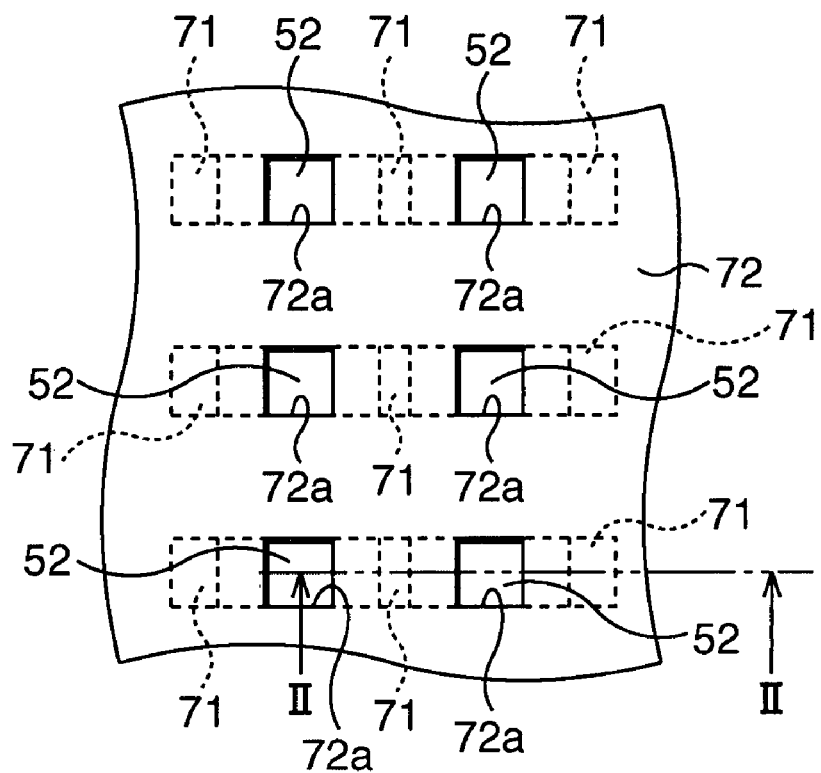
FIG. 44A is a plan view showing, as continued from FIG. 43A, the method of manufacturing a semiconductor device according to the fourth embodiment.
Figure 44B:
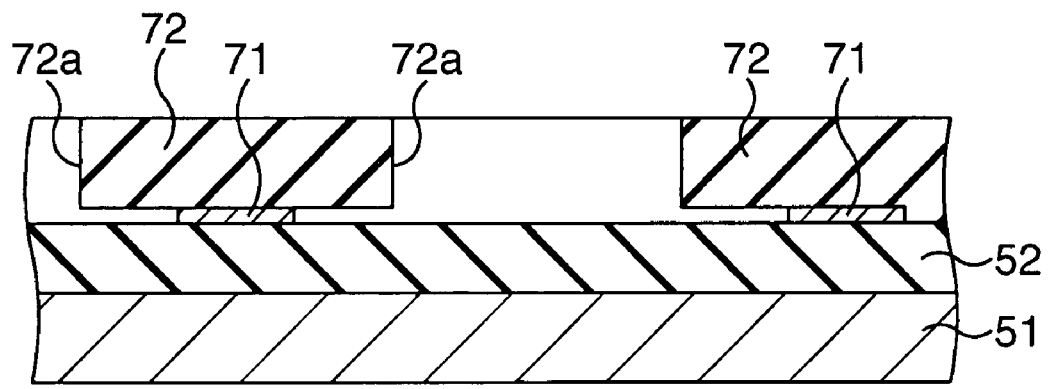
FIG. 44B is a sectional view taken along line II-II in FIG. 44A.

Next, as shown in FIG. 44A and FIG. 44B, the end portions of the dot patterns 71 are isotropically recessed by wet etching or the like. As a consequence, a gap is formed between the insulating film 72 and the Si oxide film 52.

Figure 45A:
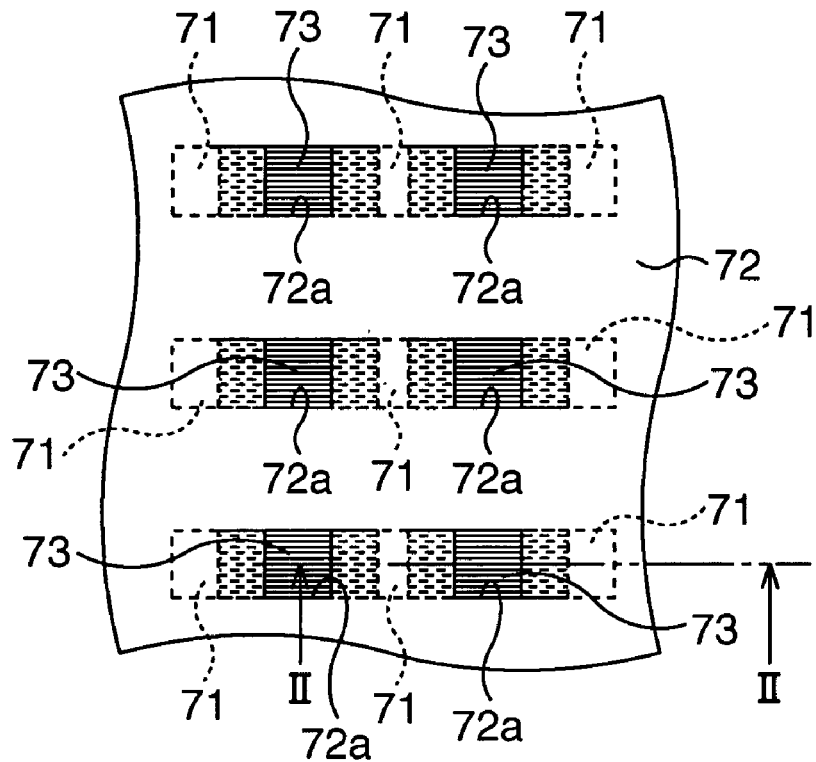
FIG. 45A is a plan view showing, as continued from FIG. 44A, the method of manufacturing a semiconductor device according to the fourth embodiment.
Figure 45B:
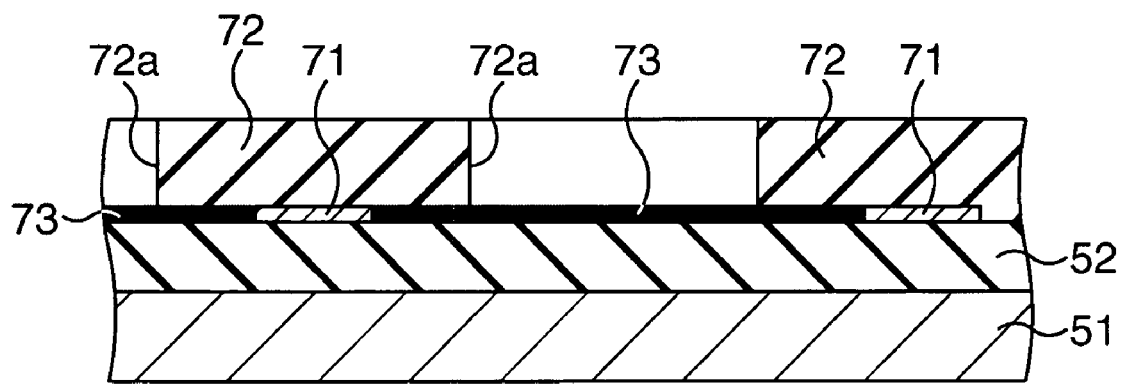
FIG. 45B is a sectional view taken along line II-II in FIG. 45A.

Next, as shown in FIG. 45A and FIG. 45B, carbon nanotubes 73 are grown as being originated from the dot patterns 71, by a thermal CVD process or a plasma CVD process.

According to the fourth embodiment as described above, the carbon nanotubes 73 are almost unlikely to grow upward, and instead grow between the opposed dot patterns 71 with a strong certainty. The carbon nanotubes 55 in the third embodiment grew also upward, because the dot patterns 53 swelled out from the trenches 54a. There is a possibility that the carbon nanotubes 55 could not thoroughly be grown in the horizontal direction, as being affected by a taper angle and flatness of the side faces of the dot patterns 53. It is therefore necessary to remove unnecessary portions of the carbon nanotubes 55 in the later process. In contrast to this, the carbon nanotubes 73 in the fourth embodiment are likely to grow in the horizontal direction, so that there is no need of removing the unnecessary carbon nanotubes in the later process.

Readiness of the horizontal growth of the carbon nanotubes 73 increases as the amount of recessing of the dot patterns 71 increases. If deformation of the trenches 71a is anticipated in the process of growing the carbon nanotubes 73, it is good enough to control thickness of the insulating film.

Figure 46A:
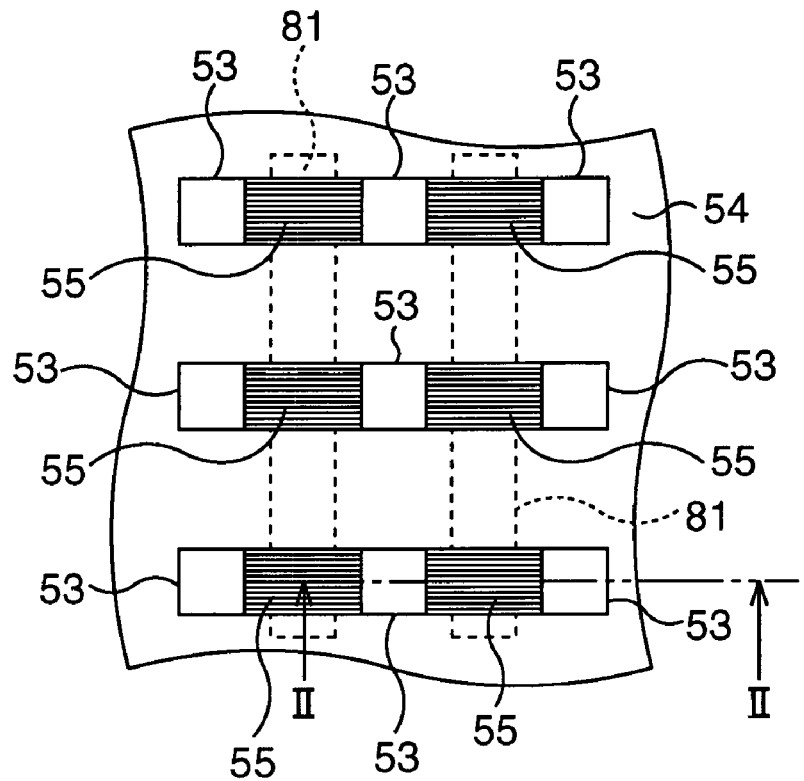
FIG. 46A is a plan view showing an exemplary in which a back gate structure is adopted.
Figure 46B:
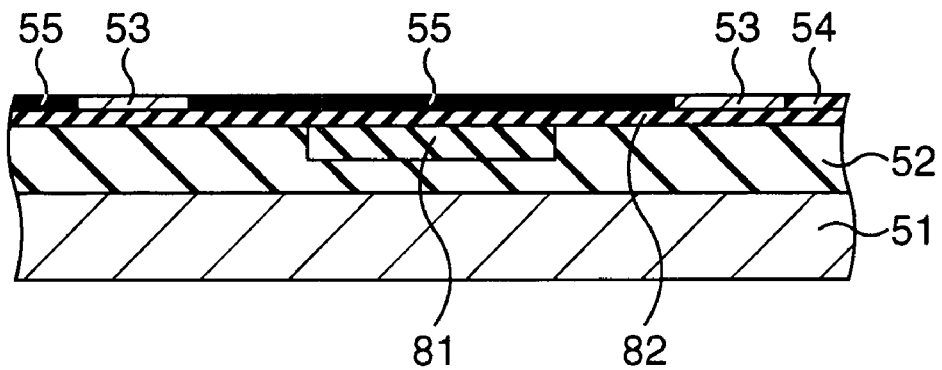
FIG. 46B is a sectional view taken along line II-II in FIG. 46A.

The gate electrodes of the field effect transistors are not necessarily formed on the gate insulating film, allowing adoption of the back gate structure as shown in FIG. 46A and FIG. 46B. A method of obtaining this sort of structure is as follows. For example, a Si oxide film 52 is configured as a double-layered structure, wherein gate electrodes 81 are formed after the first layer has been formed. Next, a Si oxide film on the second layer is formed, and thereafter a gate insulating film 82 is formed. The dot patterns 53 and the carbon nanotubes 55 are then formed similarly to as in the third embodiment. It is also allowable to adopt a damascene process, so as to bury the gate electrodes 81 in the Si oxide film 52.

The carbon nanotubes having a zigzag chirality are given as P-type in their as-grown state. On the contrary, the carbon nanotubes annealed in vacuo change their conductivity type into N-type. This phenomenon is supposed as being ascribable to presence or absence of oxygen adsorption at the junction portions of the carbon nanotubes and the metal catalyst. In other words, it has been believed that the annealing in vacuo causes elimination of oxygen from the junction portion, and conversion into N-type. By using this phenomenon, an inverter can be formed as shown in FIG. 47A to FIG. 47C.

Figure 47A:
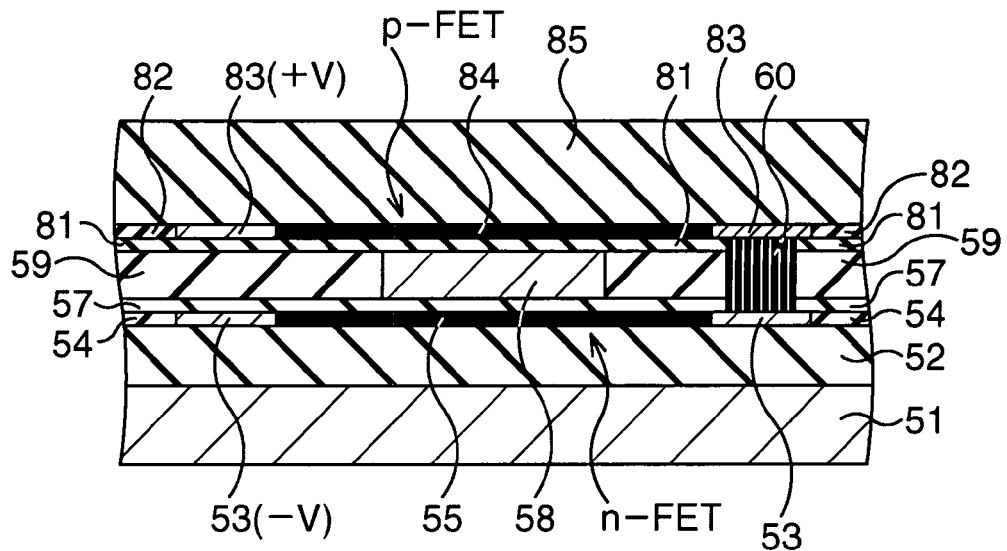
FIG. 47A is a block diagram showing an inverter.
Figure 47B:
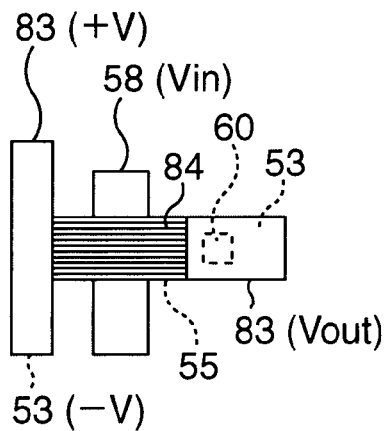
FIG. 47B is a layout chart showing the inverter.
Figure 47C:
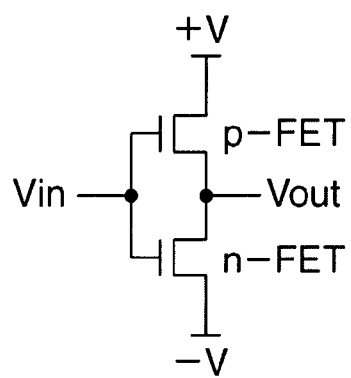
FIG. 47C is a circuit drawing showing the inverter.

In the transistors shown in FIG. 47A to FIG. 47C, the gate electrodes shared by these transistors corresponds to an input terminal, and the drain (dot patterns 83 and 53) connected through the carbon nanotubes 60 corresponds to an output terminal. The source (dot pattern 83) in the upper layer is applied with a positive voltage, and the source (dot pattern 53) in the lower layer is applied with a negative voltage.

Figure 48:
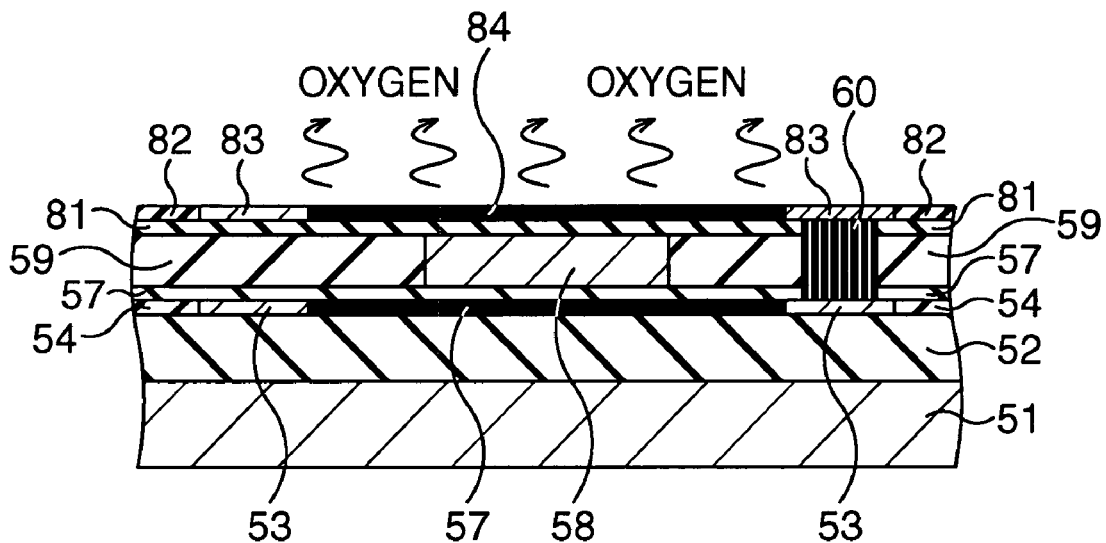
FIG. 48 is a sectional view showing a method of forming an inverter.

This structure can be obtained by the following procedures, for example. First, similarly to as in the third embodiment, the process steps up to the formation of the interlayer insulating film 59 are carried out. Next, the interlayer insulating film 59 is planarized by CMP or the like, until the gate electrodes 58 expose. Next, the gate insulating film 81 is formed. Thereafter, via-plugs composed of the carbon nanotubes 60 are formed in the gate insulating film 81 and the interlayer insulating film 59. The insulating film 82, the dot patterns 83 and the carbon nanotubes 84 are then formed. Next, as shown in FIG. 48, oxygen is eliminated by annealing in vacuo, to thereby convert the conductivity type of the carbon nanotubes 84 from P-type into N-type. Thereafter, an interlayer insulating film 85 is formed over the entire surface. In thus-obtained inverter, the carbon nanotubes 55 show P-type conductivity and the carbon nanotubes 84 show N-type conductivity, under no applied voltage. In other words, the lower transistor operates as an N-channel transistor, and the upper transistor operates as a P-channel transistor.

Silicon-base integrated circuits are generally configured by two-dimensionally arranging a plurality of transistors so as to form circuits such as inverters, whereas use of the transistors using the carbon nanotubes as the channels makes it possible to arrange a plurality of transistors in the vertical direction as described above. This is ascribable to a large degree of freedom of carbon nanotubes which are not necessarily formed on the surface of substrates.

Figure 49:
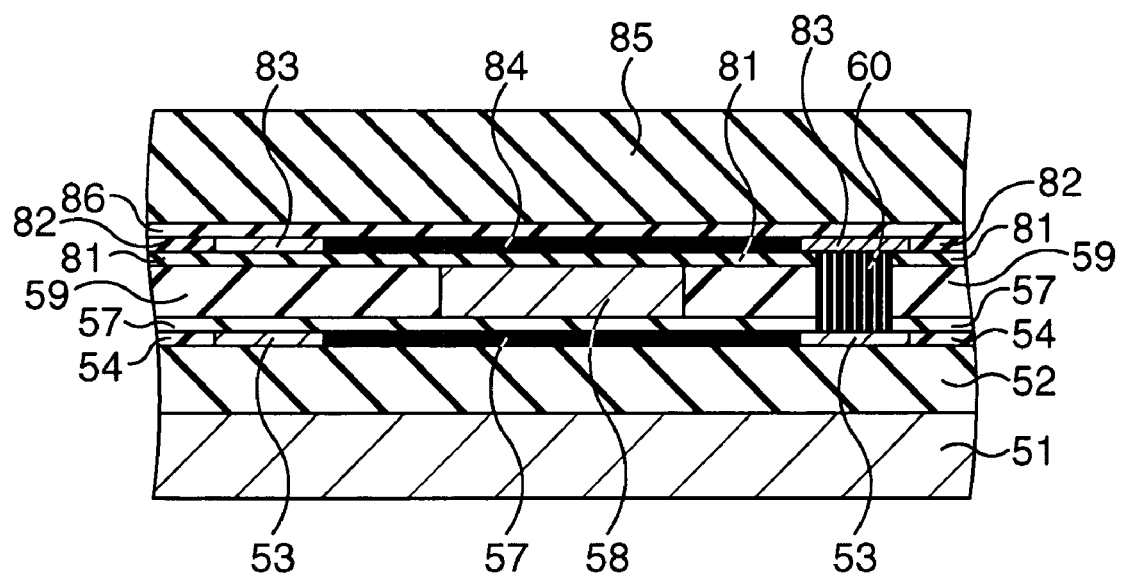
FIG. 49 is a sectional view showing an exemplary in which an oxygen blocking film 86 is formed.

It has also been reported that the conductivity type of the carbon nanotubes returns back to P-type, when allowed to stand in the air after annealing, due to re-adhesion of oxygen to the junction portion. It is, therefore, preferable that the annealing as shown in FIG. 48 is followed, for example, by in situ formation of an oxygen blocking film 86 as shown in FIG. 49. By forming the oxygen blocking film 86, the conductivity type is successfully prevented from returning back due to the re-adhesion of oxygen. The oxygen blocking film 86 functions also as a barrier against the oxidative atmosphere for forming the interlayer insulating film 85 in the later process. As this sort of oxygen blocking film 86, those requiring no oxidative atmosphere for the formation thereof, and having therein only a small oxygen content are preferable. Silicon nitride film is one example.

It is to be understood that, making the sectional geometry of the origin pattern reverse-tapered is effective also for the case where the channel composed of the carbon nanotubes is formed.

Species of the interlayer insulating film is not specifically limited, allowing use of a porous low dielectric constant film or the like, besides the Si oxide film.

INDUSTRIAL APPLICABILITY

As has been detailed in the above, according to the present invention, fine wirings and channels composed of carbon nanotubes can readily be formed with excellent accuracy.

What is claimed is:

1. A semiconductor device comprising:
   a semiconductor substrate;
   an insulating film formed over said semiconductor substrate, a trench being formed in said insulating film;
   a wiring composed of carbon nanotubes formed in said trench and extending in parallel with a surface of said semiconductor substrate; and
   origin patterns connected to both ends of said carbon nanotubes and containing a metal catalyst in a portion in contact with the end of said carbon nanotube,
   wherein said origin patterns have a reverse-tapered sectional geometry.

2. The semiconductor device according to claim 1, wherein said metal catalyst is at least one metal selected from a group consisting of cobalt, nickel and iron.

3. The semiconductor device according to claim 2, wherein said origin patterns are located only at an origin point, an end point, and an inflection point of said wiring.

4. The semiconductor device according to claim 3, further comprising
   via-plugs composed of carbon nanotubes extending upward from said origin patterns; and second origin patterns formed on said via-plugs.

5. The semiconductor device according to claim 1, wherein each of said origin patterns comprises:
   a base; and
   a metal catalyst film formed on a surface of said base.

6. The semiconductor device according to claim 5, wherein said base has a Ti-containing portion at a portion thereof in contact with said metal catalyst film.

7. The semiconductor device according to claim 1, wherein said carbon nanotubes are of an armchair type.

8. A semiconductor device comprising:
   a semiconductor substrate;
   a plurality of semiconductor elements formed on a surface of said semiconductor substrate; and
   a multi-layered wiring connecting said plurality of semiconductor elements,
   wherein
   at least a portion of said multi-layered wiring extending in parallel with the surface of said substrate is composed of carbon nanotubes exposed to an external environment,
   said plurality of semiconductor elements is covered with an interlayer insulating film and an etching stopper layer formed over the interlayer insulating film, and
   origin patterns are connected to both ends of said carbon nanotubes, said origin patterns containing a metal catalyst in a portion in contact with the end of said carbon nanotube, and having a reverse-tapered sectional geometry.

9. A semiconductor device comprising: a semiconductor substrate;
   a source and a drain formed over said semiconductor substrate, and composed of origin patterns containing a metal catalyst;
   a channel formed between said source and said drain, and composed of carbon nanotubes;
   a gate insulating film in contact with said channel; and
   a gate sandwiching said gate insulating film with said channel
   wherein said semiconductor device has in a vertical direction thereof a plurality of field effect transistors each having said source, drain, channel, gate insulating film and gate, and
   said gate is shared by two arbitrary field effect transistors adjacent to each other in a direction normal to a surface of said semiconductor substrate, out of said plurality of field effect transistors,
   wherein said origin patterns have a reverse-tapered sectional geometry.

10. The semiconductor device according to claim 9, wherein said metal catalyst is at least one metal selected from a group consisting of cobalt, nickel and iron.

11. The semiconductor device according to claim 9, further comprising a via-plug or a wiring composed of carbon nanotubes, selectively connecting electrodes composing said plurality of field effect transistors.

12. The semiconductor device according to claim 9, having an inverter circuit containing said two field effect transistors.

13. The semiconductor device according to claim 9, wherein each of said origin patterns comprises:
   a base; and a metal catalyst film formed on a surface of said base.

14. The semiconductor device according to claim 13, wherein said base has a Ti-containing portion at a portion thereof in contact with said metal catalyst film.

15. The semiconductor device according to claim 9, wherein said carbon nanotubes are of a zigzag type.

* * * * *